US009257168B2

(12) United States Patent
Nakamura et al.

(10) Patent No.: US 9,257,168 B2
(45) Date of Patent: Feb. 9, 2016

(54) MAGNETIC RECORDING DEVICE AND MAGNETIC RECORDING APPARATUS

(71) Applicant: KABUSHIKI KAISHA TOSHIBA, Tokyo (JP)

(72) Inventors: Shiho Nakamura, Kanagawa-ken (JP); Hirofumi Morise, Kanagawa-ken (JP); Satoshi Yanagi, Kanagawa-ken (JP); Daisuke Saida, Tokyo (JP); Akira Kikitsu, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 65 days.

(21) Appl. No.: 14/078,228

(22) Filed: Nov. 12, 2013

(65) Prior Publication Data

US 2014/0078807 A1 Mar. 20, 2014

Related U.S. Application Data

(62) Division of application No. 13/299,130, filed on Nov. 17, 2011, now Pat. No. 8,611,142, which is a division of application No. 12/216,918, filed on Jul. 11, 2008, now Pat. No. 8,085,582.

(30) Foreign Application Priority Data

Jul. 11, 2007 (JP) .................. 2007-182286

(51) Int. Cl.
*G11C 11/22* (2006.01)
*G11C 11/16* (2006.01)
*G11B 5/66* (2006.01)

(52) U.S. Cl.
CPC *G11C 11/22* (2013.01); *G11B 5/66* (2013.01); *G11C 11/16* (2013.01)

(58) Field of Classification Search
CPC ........ G11C 11/22; G11C 11/16; G11C 11/14; G11C 11/15; G11B 5/66
See application file for complete search history.

(56) References Cited

U.S. PATENT DOCUMENTS

| 6,532,164 B2 | 3/2003 | Redon et al. |
| 6,603,677 B2 | 8/2003 | Redon et al. |

(Continued)

FOREIGN PATENT DOCUMENTS

| JP | 2002-261352 | 9/2002 |
| JP | 2005-285242 | 10/2005 |

(Continued)

OTHER PUBLICATIONS

Office Action dated Mar. 10, 2011 in Japanese Application No. 2007-182286, and English-language translation thereof.

(Continued)

*Primary Examiner* — J. H. Hur
(74) *Attorney, Agent, or Firm* — Nixon & Vanderhye, P.C.

(57) ABSTRACT

An example magnetic recording device includes a magnetic recording section and a magnetization oscillator and a first nonmagnetic layer disposed between the magnetic recording section and the magnetization oscillator. The magnetic recording section includes a first ferromagnetic layer with a magnetization substantially fixed in a first direction; a second ferromagnetic layer with a variable magnetization direction; and a second nonmagnetic layer disposed between the first ferromagnetic layer and the second ferromagnetic layer. The magnetization oscillator includes a third ferromagnetic layer with a variable magnetization direction; a fourth ferromagnetic layer with a magnetization substantially fixed in a second direction; and a third nonmagnetic layer disposed between the third ferromagnetic layer and the fourth ferromagnetic layer.

16 Claims, 10 Drawing Sheets

(56) References Cited

U.S. PATENT DOCUMENTS

| | | |
|---|---|---|
| 6,980,463 B2 | 12/2005 | Hosotani et al. |
| 6,980,469 B2 | 12/2005 | Kent et al. |
| 7,224,601 B2 | 5/2007 | Panchula |
| 7,381,480 B2 | 6/2008 | Nakamura et al. |
| 7,598,578 B2 | 10/2009 | Nakamura et al. |
| 7,817,375 B2 | 10/2010 | Sato et al. |
| 8,085,582 B2 | 12/2011 | Nakamura et al. |
| 8,611,142 B2 | 12/2013 | Nakamura et al. |
| 2002/0105823 A1 | 8/2002 | Redon et al. |
| 2002/0105827 A1 | 8/2002 | Redon et al. |
| 2004/0165425 A1* | 8/2004 | Nakamura et al. ............ 365/171 |
| 2006/0092696 A1 | 5/2006 | Bessho |
| 2007/0047294 A1 | 3/2007 | Panchula |
| 2007/0064342 A1* | 3/2007 | Nakamura et al. ............ 360/119 |
| 2007/0096229 A1 | 5/2007 | Yoshikawa et al. |
| 2007/0297220 A1* | 12/2007 | Yoshikawa et al. ............ 365/158 |
| 2009/0015958 A1 | 1/2009 | Nakamura et al. |
| 2009/0207724 A1 | 8/2009 | Yanagi et al. |

FOREIGN PATENT DOCUMENTS

| | | |
|---|---|---|
| JP | 2006-128579 | 5/2006 |
| JP | 2006-179694 | 7/2006 |
| JP | 2007-088068 | 4/2007 |
| JP | 2007-150265 | 6/2007 |

OTHER PUBLICATIONS

Office Action dated Aug. 15, 2011 in Japanese Application No. 2007-182286, and English-language translation thereof.

Albert, F.J. et al., "Spin-Polarized Current Switching of a Co Thin Film Nanomagnet", Applied Physics Letters, vol. 77, No. 23, pp. 3809-3811 (Dec. 4, 2000).

Kaka, S. et al., "Spin Transfer Switching of Spin Valve Nanopillars Using Nanosecond Pulsed Currents", Journal of Magnetism and Magnetic Materials, vol. 286, pp. 375-380 (2005).

Office Action dated Jul. 29, 2013 in counterpart Japanese Application No. 2011-226721 and English-language translation thereof.

* cited by examiner

NORMAL TYPE: LOW RESISTANCE ("0" OR "1")
REVERSE TYPE: HIGH RESISTANCE ("0" OR "1")

NORMAL TYPE: HIGH RESISTANCE ("1" OR "0")
REVERSE TYPE: LOW RESISTANCE ("1" OR "0")

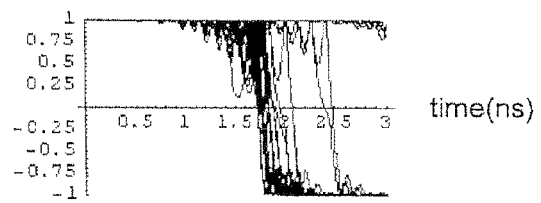
FIG. 10A   0.1GHz
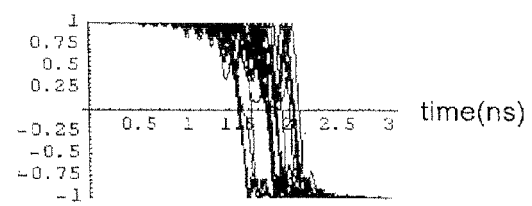
FIG. 10B   2GHz
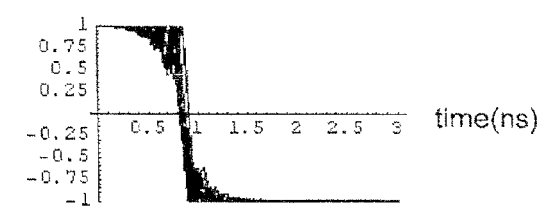
FIG. 10C   4GHz
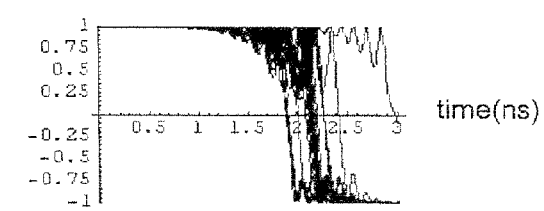
FIG. 10D   10GHz
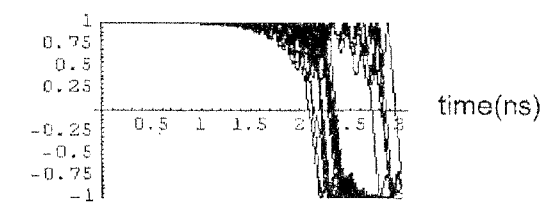
FIG. 10E   15GHz

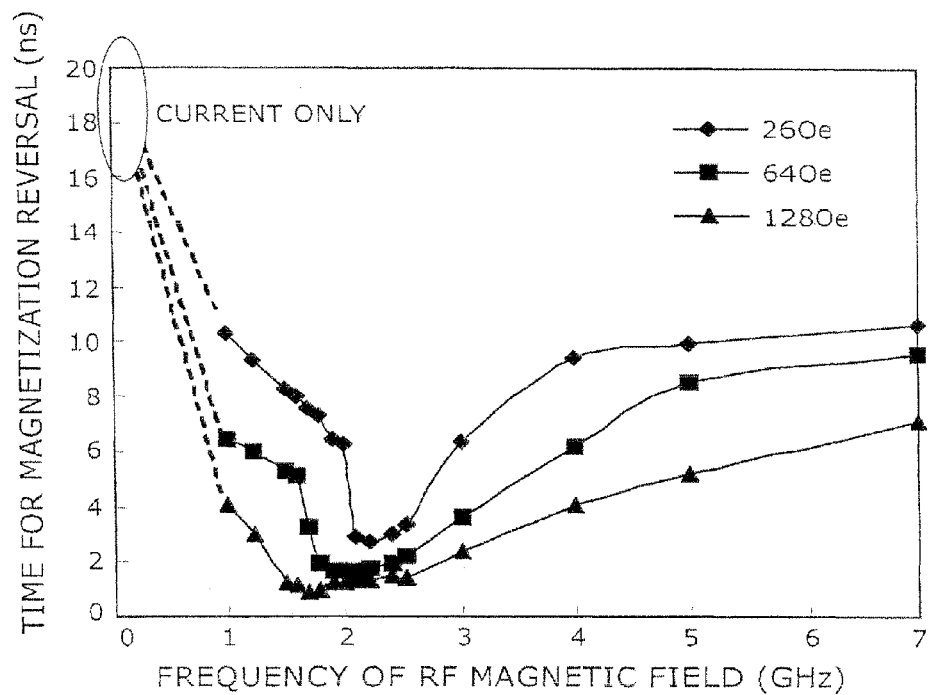

FIG. 11

| SAMPLE NO. | MAGNETIC PINNED LAYER 10b | MAGNETIZATION ROTATION LAYER 50 | MAGNETIC RECORDING SECTION 3 | WRITING PROBABILITY FOR RECORDING WITH 2-nsec PULSE | PRESENT INVENTION APPLIED |
|---|---|---|---|---|---|
| S1 | PERPENDICULAR MAGNETIZATION | LONGITUDINAL MAGNETIZATION | LONGITUDINALLY MAGNETIZED FILM | 1 | YES |
| R1 | PERPENDICULAR MAGNETIZATION | PERPENDICULAR MAGNETIZATION | LONGITUDINALLY MAGNETIZED FILM | 0.1 | NO |
| R2 | LONGITUDINAL MAGNETIZATION | LONGITUDINAL MAGNETIZATION | LONGITUDINALLY MAGNETIZED FILM | 0 | NO |
| R3 | NONE | NONE | LONGITUDINALLY MAGNETIZED FILM | 0 | NO |

FIG. 12

MAGNETIC RECORDING DEVICE AND MAGNETIC RECORDING APPARATUS

CROSS-REFERENCE TO RELATED APPLICATIONS

This application is based upon and claims the benefit of priority from the prior Japanese Patent Application No. 2007-182286, filed on Jul. 11, 2007; the entire contents of which are incorporated herein by reference.

BACKGROUND OF THE INVENTION

1. Field of the Invention

This invention relates to a magnetic recording device and a magnetic recording apparatus in which a radio-frequency magnetic field is applied in combination with a write current.

2. Background Art

Applying a magnetic field is a conventional method for controlling the magnetization direction of a magnetic material. For example, in a hard disk drive (HDD), the magnetization direction of a medium is reversed by a magnetic field generated from a recording head to perform write operation. In a conventional magnetic random access memory, a current is passed through an interconnect disposed near a magneto resistive effect device to generate a current-induced magnetic field, which is applied to a cell to control the magnetization direction of the cell. These methods for controlling the magnetization direction by an external magnetic field (writing methods based on a current-induced magnetic field) have a long history and can be regarded as well-established techniques.

On the other hand, the recent progress in nanotechnology has enabled significant downscaling of magnetic materials. This has created a need to locally control magnetization at the nanoscale. However, a magnetic field intrinsically has the nature of spreading in space, and is difficult to localize. In selecting a particular bit or cell and controlling its magnetization direction, the problem of "crosstalk", that is, extension of magnetic field to an adjacent bit or cell, becomes prominent with the downscaling of the bit or cell. On the contrary, downsizing the source of magnetic field to localize the magnetic field causes the problem of failing to generate a magnetic field enough to control the magnetization direction.

As a technique for solving these problems, the "spin injection induced magnetization reversal" is proposed, in which a current is passed through a magnetic material to induce magnetization reversal (e.g., F. J. Albert, et al., Appl. Phys. Lett. 77, 3809 (2000), hereinafter referred to as Non-Patent Document 1).

In the technique disclosed in Non-Patent Document 1, a spin injection current serving as a write current is passed through a magnetoresistive effect device to generate spin-polarized electrons, which are used for magnetization reversal. Specifically, the angular momentum of spin-polarized electrons is transferred to electrons in a magnetic material serving as a magnetic recording layer, and thereby the magnetization of the magnetic recording layer is reversed.

This type of technique for magnetization reversal directly driven by current (spin injection induced magnetization reversal technique) facilitates locally controlling magnetization at the nanoscale, and the value of the spin injection current can be decreased in accordance with the downscaling of the magnetic material. This facilitates realizing spin electronics devices such as hard disk drives and magnetic random access memories with high recording density.

Furthermore, there is a magnetic recording apparatus in which an alternating current is passed through a bit line or a word line to generate an alternating magnetic field (e.g., United States Patent Application Publication No. 2007/0047294, hereinafter referred to as Patent Document 1).

The magnetic recording apparatus disclosed in Patent Document 1 comprises a matrix of recording cells, each being addressable by a row (bit line) and a column (word line). Each magnetic cell has a ferromagnetic pinned layer, a barrier layer, and a ferromagnetic free layer (recording layer), and is subjected to writing in accordance with the orientation of current. Each magnetic cell is provided with a series-connected switching device (transistor). Each magnetic cell is connected to one bit line, and each switching device (transistor) is connected to one word line. The apparatus further includes a direct current power supply for passing a direct current at the time of recording, and an alternating current power supply for generating an alternating magnetic field.

Non-Patent Document 2: Shehzaad Kaka, et al., Journal of Magnetism and Magnetic Materials, Volume 286 (2005) p. 375

SUMMARY OF THE INVENTION

According to an aspect of the invention, there is provided a magnetic recording device including: a laminated body including: a first ferromagnetic layer with a magnetization substantially fixed in a first direction; a second ferromagnetic layer with a variable magnetization direction; a first nonmagnetic layer disposed between the first ferromagnetic layer and the second ferromagnetic layer; and a third ferromagnetic layer with a variable magnetization direction, the magnetization direction of the second ferromagnetic layer being determinable in response to the orientation of a current, by allowing electrons spin-polarized by passing a current in a direction generally perpendicular to the film plane of the layers of the laminated body to act on the second ferromagnetic layer, and by allowing a magnetic field generated by precession of the magnetization of the third ferromagnetic layer to act on the second ferromagnetic layer.

According to an aspect of the invention, there is provided a magnetic recording device including: a laminated body including a first ferromagnetic layer with a magnetization substantially fixed in a first direction, a second ferromagnetic layer with a variable magnetization direction, and a first nonmagnetic layer disposed between the first ferromagnetic layer and the second ferromagnetic layer; and a third ferromagnetic layer with a variable magnetization direction disposed close to the second ferromagnetic layer, the magnetization direction of the second ferromagnetic layer being determinable in response to the orientation of a current, by allowing electrons spin-polarized by passing a current in a direction generally perpendicular to the film plane of the layers of the laminated body to act on the second ferromagnetic layer, and by allowing a magnetic field generated by precession of the magnetization of the third ferromagnetic layer to act on the second ferromagnetic layer.

According to an aspect of the invention, there is provided a magnetic recording apparatus including: a plurality of memory cells arranged in a matrix, each memory cell including the magnetic recording device including: a laminated body including: a first ferromagnetic layer with a magnetization substantially fixed in a first direction; a second ferromagnetic layer with a variable magnetization direction; a first nonmagnetic layer disposed between the first ferromagnetic layer and the second ferromagnetic layer; and a third ferromagnetic layer with a variable magnetization direction, the magnetization direction of the second ferromagnetic layer being determinable in response to the orientation of a current, by allowing electrons spin-polarized by passing a current in a direction generally perpendicular to the film plane of the layers of the laminated body to act on the second ferromagnetic layer, and by allowing a magnetic field generated by precession of the magnetization of the third ferromagnetic layer to act on the second ferromagnetic layer.

BRIEF DESCRIPTION OF THE DRAWINGS

FIGS. 10A to 10E are graphs illustrating the temporal variation of magnetic reversal;

FIG. 11 is a schematic illustration of the dependence of time required for magnetization reversal on frequency and radio-frequency magnetic field intensity;

FIG. 12 is a table showing the result of writing probability in this working example;

DETAILED DESCRIPTION OF THE INVENTION

Figure 1:
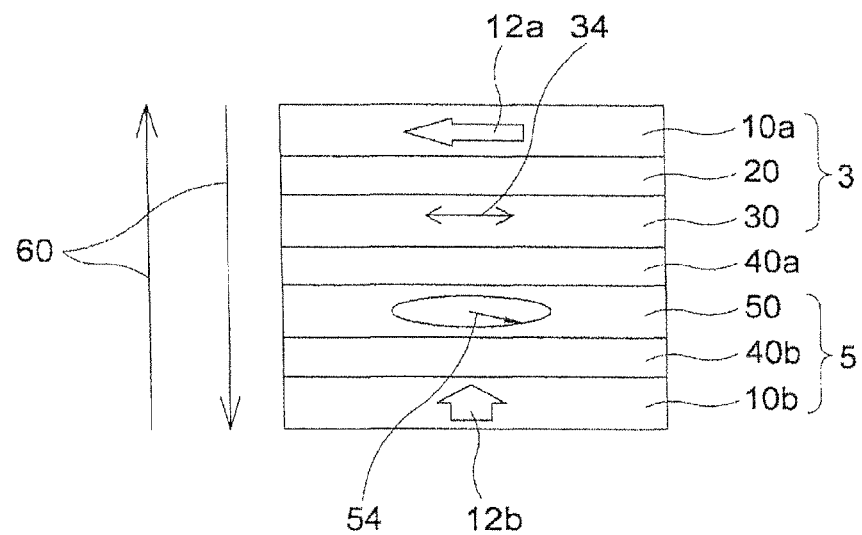
FIG. 1 is a schematic view illustrating a basic cross-sectional structure of a magnetic recording device according to a first embodiment of the invention.

Embodiments of the invention will now be described with reference to the drawings, where similar components are labeled with like reference numerals, and the detailed description thereof is omitted as appropriate.

FIG. 1 is a schematic view illustrating a basic cross-sectional structure of a magnetic recording device according to a first embodiment of the invention.

This magnetic recording device comprises a magnetic recording section 3 and a magnetization oscillator 5. The magnetic recording section 3 and the magnetization oscillator 5 are disposed adjacently across an intermediate layer 40a.

The magnetic recording section 3 includes a magnetic pinned layer 10a with a magnetization 12a fixed generally parallel to the film plane, a magnetic recording layer 30 with a magnetization easy axis 34 directed generally parallel to the film plane, and a nonmagnetic barrier layer 20 disposed between the magnetic pinned layer 10a and the magnetic recording layer 30. This laminated structure composed of the magnetic pinned layer 10a, the barrier layer 20, and the magnetic recording layer 30 is known as MTJ (magnetic tunnel junction).

The magnetization oscillator 5 includes a magnetization rotation layer 50 including a magnetic layer with a magnetization easy axis 54 directed generally parallel to the film plane, a magnetic pinned layer 10b with a magnetization 12b fixed generally perpendicular to the film plane, and an intermediate layer 40b disposed between the magnetization rotation layer 50 and the magnetic pinned layer 10b.

In the magnetic pinned layer 10b, alternatively, the magnetization 12b can be fixed generally parallel to the film plane. The magnetization rotation layer 50 and the magnetic pinned layer 10b are different in material. For example, the magnetization rotation layer 50 can be made of permalloy (Py), the intermediate layer 40b can be made of copper (Cu), and the magnetic pinned layer 10b can be made of cobalt (Co). Permalloy (Py) is a NiFe-based alloy. The direction of the magnetization easy axis 54 of the magnetization rotation layer 50 may be orthogonal to the direction of the magnetization easy axis 34 of the magnetic recording layer 30. The intermediate layer 40a disposed between the magnetic recording section 3 and the magnetization oscillator 5 is, so to speak, a spin quenching layer, having a nonmagnetic material or structure in which the spin polarization of electrons flowing generally perpendicular to the film plane of the intermediate layer 40a is quenched by the intermediate layer 40a.

The magnetic recording device of this embodiment has a structure in which the magnetic pinned layer 10b, the intermediate layer 40b, the magnetization rotation layer 50, the intermediate layer 40a, the magnetic recording layer 30, the barrier layer 20, and the magnetic pinned layer 10a are laminated in this order. An electron current 60 can be passed through this magnetic recording device using electrodes, not shown, connected to the magnetic pinned layers 10a, 10b. The magnetic recording layer 30 serves for recording, and its magnetization can be reversed relatively easily in the direction of the magnetization easy axis 34. The magnetization rotation layer 50 serves to generate a radio-frequency magnetic field at the time of recording.

The magnetic pinned layers 10a, 10b, the magnetic recording layer 30, and the magnetization rotation layer 50 are made of magnetic materials. The magnetization pinning of the magnetic pinned layer 10a, 10b can be reinforced by disposing an antiferromagnetic layer, not shown, adjacent to the magnetic pinned layer 10a, 10b. Each of the magnetic pinned layers 10a, 10b, the magnetic recording layer 30, and the magnetization rotation layer 50 can be a single layer, or can be made of multilayer films, which are ferromagnetically or antiferromagnetically coupled to each other. The barrier layer 20 is made of a nonmagnetic, high-resistance insulating material or semiconductor. The intermediate layer 40*a*, 40*b* is made of a nonmagnetic conductive metal, semiconductor, or insulator.

In the magnetic recording device of this embodiment, the magnetic recording layer 30 made of a magnetic material is adjacent to the magnetization rotation layer 50. Hence a material having spin quenching capability is used for the intermediate layer 40*a*. If spin information is retained in the intermediate layer 40*a* as in the conventional case, spin transfer torque from the magnetic recording layer 30 affects the magnetization rotation layer 50 and decreases the controllability of the magnetization rotation of the magnetization rotation layer 50. Thus the rotation direction may be varied with the orientation of current flow. To prevent this, the intermediate layer 40*a* is provided with spin quenching capability. Furthermore, the thickness of the intermediate layer 40*a* is preferably 1.4 nm or more so as to avoid interlayer magnetic coupling between the magnetic recording layer 30 and the magnetization rotation layer 50.

In the magnetic recording device according to this embodiment, the magnetization direction of the magnetic recording layer 30 can be controlled by passing an electron current 60 between the upper and lower magnetic pinned layer 10*a*, 10*b*. Specifically, the magnetization orientation of the magnetic recording layer 30 can be reversed by switching the flowing orientation (polarity) of the electron current 60. Information can be recorded by assigning "0" and "1" to each magnetization direction of the magnetic recording layer 30.

Here, the basic mechanism of "writing" in the magnetic recording device is described.

Figure 2A:
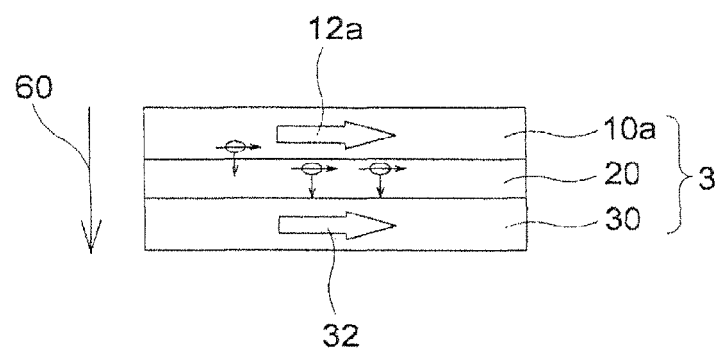
FIGS. 2A and 2B are schematic cross-sectional views for illustrating the mechanism of "writing" in the magnetic recording device shown in FIG. 1.
Figure 2B:
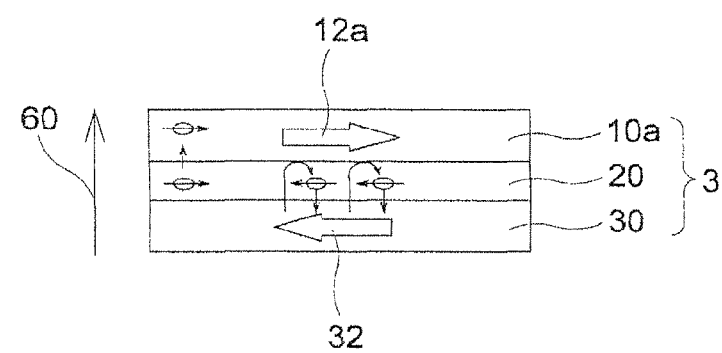

FIG. 2 is a schematic cross-sectional view for illustrating the mechanism of "writing" in the magnetic recording device shown in FIG. 1. More specifically, FIG. 2A is a schematic cross-sectional view showing the case where an electron current 60 is passed from the magnetic pinned layer 10*a* toward the magnetic recording layer 30, and FIG. 2B is a schematic cross-sectional view showing the case where an electron current 60 is passed from the magnetic recording layer 30 toward the magnetic pinned layer 10*a*. For convenience, the magnetization oscillator 5 and the intermediate layer 40*a* in the magnetic recording device shown in FIG. 1 are omitted.

The mechanism of writing to the magnetic recording layer 30 by passing an electron current 60 across the film plane of the magnetic pinned layer 10*a* and the magnetic recording layer 30 is described as follows. The description is given of the case where the magnetoresistive effect through the barrier layer 20 is of the normal type. Here, the magnetoresistive effect of the "normal type" refers to the case where the electric resistance is higher when the magnetizations of the magnetic layers on both sides of the barrier layer are antiparallel than when they are parallel. That is, in the case of the normal type, the electric resistance between the magnetic pinned layer 10*a* and the magnetic recording layer 30 through the barrier layer 20 is lower when the magnetizations of the magnetic pinned layer 10*a* and the magnetic recording layer 30 are parallel than when they are antiparallel.

First, in FIG. 2A, electrons that have passed through the magnetic pinned layer 10*a* having a magnetization 12*a* generally parallel to the film plane take on spin parallel to the magnetization 12*a*. When these electrons flow into the magnetic recording layer 30, the angular momentum of this spin is transferred to the magnetic recording layer 30 and acts on its magnetization 32, that is, a so-called spin transfer torque is exerted thereon. Thus the magnetic recording layer 30 takes on a magnetization 32 parallel (rightward in this figure) to the magnetization 12*a*. To the magnetic recording layer 30 having the magnetization 32 of this orientation (rightward in this figure), "0" is illustratively assigned.

FIG. 2B shows the case where the orientation of the electron current 60 is reversed. Among the electrons that have passed through the barrier layer 20, electrons with spin parallel (rightward in this figure) to the magnetization 12*a* pass through the magnetic pinned layer 10*a*, whereas electrons with spin antiparallel (leftward in this figure) to the magnetization 12*a* are reflected at the interface between the magnetic pinned layer 10*a* and the barrier layer 20. The angular momentum of the spin of these reflected electrons is transferred to the magnetic recording layer 30 and acts on its magnetization 32, that is, a so-called spin transfer torque is exerted thereon. Thus the magnetic recording layer 30 takes on a magnetization 32 antiparallel (leftward in this figure) to the magnetization 12*a*. To the magnetic recording layer 30 having the magnetization 32 of this orientation (leftward in this figure), "1" is illustratively assigned.

By the foregoing action, "0" and "1" are suitably assigned to the magnetic recording layer 30, and "writing" in the magnetic recording device is completed. The foregoing has described the case where the magnetoresistive effect between the magnetic pinned layer 10*a* and the magnetic recording layer 30 through the barrier layer 20 is of the "normal type".

The magnetoresistive effect of the "reverse type" refers to the case where the electric resistance is higher when the magnetizations of the magnetic layers on both sides of the barrier layer are parallel than when they are antiparallel. That is, in the case of the reverse type, the electric resistance between the magnetic pinned layer 10*a* and the magnetic recording layer 30 through the barrier layer 20 is higher when the magnetizations of the magnetic pinned layer 10*a* and the magnetic recording layer 30 are parallel than when they are antiparallel. Thus, electrons that have passed through the magnetic pinned layer 10*a* take on spin antiparallel to the magnetization 12*a*. Furthermore, electrons with spin parallel to the magnetization 12*a* are reflected, whereas electrons with spin antiparallel to the magnetization 12*a* pass through the magnetic pinned layer 10*a*. The subsequent mechanism of "writing" is the same as that for the case where the magnetoresistive effect is of the "normal type", and hence the detailed description thereof is omitted.

Next, the mechanism of "reading" in the magnetic recording device is described.

In the magnetic recording device of this embodiment, the direction of the magnetization 32 of the magnetic recording layer 30 can be detected by using the "magnetoresistive effect" in which the electric resistance varies with the relative orientation of the magnetization of each layer. That is, in the case of using the magnetoresistive effect, the magnetoresistance can be measured by passing a sense current 61 between the magnetic pinned layer 10*a* and the magnetic recording layer 30. The value of the sense current 61 is lower than the value of the electron current 60 passed at the time of recording.

Figure 3A:
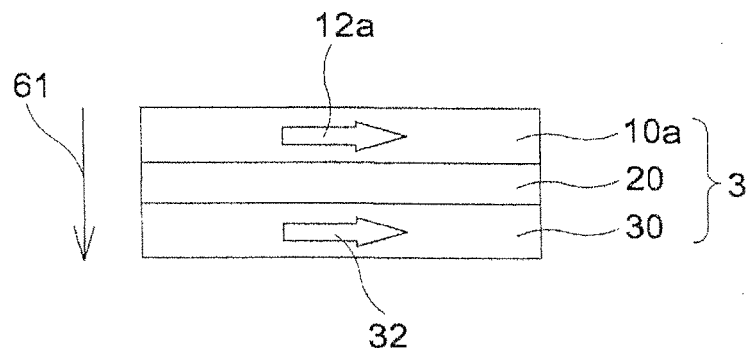
FIGS. 3A and 3B are schematic cross-sectional views for illustrating the mechanism of "reading" in the magnetic recording device shown in FIG. 1.
Figure 3B:
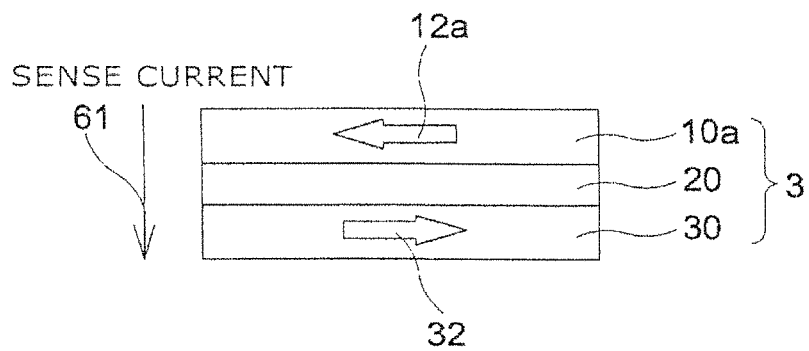
Figure 4A:
FIGS. 4A to 4E are schematic views illustrating the intermediate layer disposed between the magnetic recording layer and the magnetization rotation layer according to this embodiment.
Figure 4B:
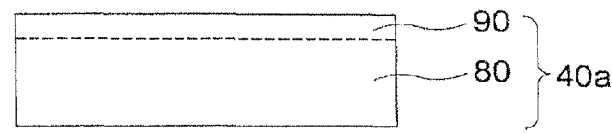
Figure 4C:
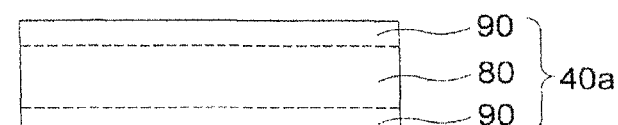
Figure 4D:
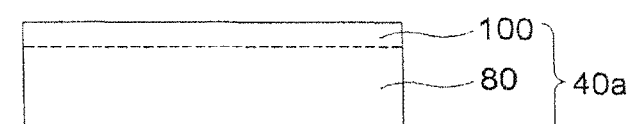
Figure 4E:
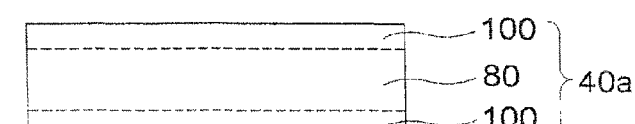

FIG. 3 is a schematic cross-sectional view for illustrating the mechanism of "reading" in the magnetic recording device shown in FIG. 1. More specifically, FIG. 3A is a schematic cross-sectional view showing the case where the magnetization 12*a* of the magnetic pinned layer 10*a* is parallel to the magnetization 32 of the magnetic recording layer 30, and FIG. 3B is a schematic cross-sectional view showing the case where the magnetization 12*a* of the magnetic pinned layer 10*a* is antiparallel to the magnetization 32 of the magnetic recording layer 30. For convenience, the magnetization oscillator 5 and the intermediate layer 40*a* in the magnetic recording device shown in FIG. 1 are omitted.

In the magnetic recording device shown in FIG. 3A, the magnetoresistance detected by passing a sense current 61 has a relatively low value in the magnetoresistive effect of the normal type, and a relatively high value in the magnetoresistive effect of the reverse type.

In the magnetic recording device shown in FIG. 3B, the magnetoresistance detected by passing a sense current 61 has a relatively high value in the magnetoresistive effect of the normal type, and a relatively low value in the magnetoresistive effect of the reverse type.

Recording and reading of a binary data can be made by associating "0" and "1" with these states with different resistances. Alternatively, the orientation of the sense current 61 can be opposite (upward in FIG. 3) to the direction of the arrow shown in FIG. 3.

Next, the operation of the magnetic recording device according to this embodiment at the time of recording is described.

In the magnetic recording device of this embodiment, in the case where an electron current 60 flows from the magnetic pinned layer 10a to the magnetic recording layer 30 in FIG. 1 (downward in this figure), electrons passing through the magnetic pinned layer 10a take on spin parallel to the magnetization 12a as described above. Hence the magnetic recording layer 30 takes on a magnetization 32 parallel (leftward in this figure) to the magnetization 12a.

Simultaneously with this write operation, the electron current 60 flows from the magnetization rotation layer 50 to the magnetic pinned layer 10b (downward in this figure). Hence, electrons with spin parallel to the magnetization 12b of the magnetic pinned layer 10b pass through the magnetic pinned layer 10b, whereas electrons with spin antiparallel to the magnetization 12b are reflected at the interface between the magnetic pinned layer 10b and the intermediate layer 40b. When these reflected electrons flow into the magnetization rotation layer 50, the magnetization of the magnetization rotation layer 50 undergoes precession by the effect of the electron spin (spin transfer torque). Consequently, a radio-frequency magnetic field is generated from the magnetization rotation layer 50.

On the other hand, the electron current 60 that has passed through the magnetic recording layer 30 of the magnetic recording section 3 also acts on the magnetization of the magnetization rotation layer 50 of the magnetization oscillator 5. However, the intermediate layer 40a made of a spin quenching layer is interposed between the magnetic recording layer 30 and the magnetization rotation layer 50, and hence the spin information of electrons traversing the intermediate layer 40a is significantly attenuated. Consequently, the magnetization of the magnetization rotation layer 50 can be controlled independently of the effect of the electron spin (spin transfer torque) from the magnetic recording layer 30.

In contrast, in the case where an electron current 60 flows from the magnetic recording layer 30 to the magnetic pinned layer 10a in FIG. 1 (upward in this figure), electrons with spin parallel to the magnetization 12a of the magnetic pinned layer 10a pass through the magnetic pinned layer 10a, whereas electrons with spin antiparallel to the magnetization 12a are reflected at the interface between the magnetic pinned layer 10a and the barrier layer 20. When these reflected electrons flow into the magnetic recording layer 30, the magnetic recording layer 30 takes on a magnetization 32 antiparallel (rightward in this figure) to the magnetization 12a by the effect of the electron spin.

Simultaneously with this write operation, the electron current 60 flows from the magnetic pinned layer 10b to the magnetization rotation layer 50 (upward in this figure). Electrons passing through the magnetic pinned layer 10b take on spin parallel to the magnetization 12b. When these electrons flow into the magnetization rotation layer 50, the magnetization of the magnetization rotation layer 50 undergoes precession by the effect of the electron spin (spin transfer torque). Consequently, a radio-frequency magnetic field is generated from the magnetization rotation layer 50.

On the other hand, part of the electron current 60 that has flowed from the magnetization rotation layer 50 of the magnetization oscillator 5 to the magnetic recording layer 30 of the magnetic recording section 3 is reflected at the surface of the magnetic recording layer 30 and also acts on the magnetization of the magnetization rotation layer 50 of the magnetization oscillator 5. However, the intermediate layer 40a made of a spin quenching layer is interposed between the magnetic recording layer 30 and the magnetization rotation layer 50, and hence the spin information of electrons traversing the intermediate layer 40a is significantly attenuated. Consequently, the magnetization of the magnetization rotation layer 50 can be controlled independently of the effect of the electron spin (spin transfer torque) from the magnetic recording layer 30.

The frequency of the radio-frequency magnetic field is approximately 1 to 60 GHz, for example. This radio-frequency magnetic field has a component perpendicular to the magnetization easy axis of the magnetic recording layer 30, that is, in the direction of its magnetization hard axis. Hence, at least part of the radio-frequency magnetic field generated from the magnetization rotation layer 50 is applied in the direction of the magnetization hard axis of the magnetic recording layer 30. When the radio-frequency magnetic field generated from the magnetization rotation layer 50 is applied in the direction of the magnetization hard axis of the magnetic recording layer 30, the magnetization 32 of the magnetic recording layer 30 becomes very easy to be reversed.

If the magnetization 32 of the magnetic recording layer 30 is easy to be reversed, the magnetization reversal rate can be increased. Furthermore, the reversal variation of the magnetization 32 is reduced. Thus the value of write current can be decreased.

As described above, according to this embodiment, the magnetization rotation layer 50 for generating a radio-frequency magnetic field is adjacent to the magnetic recording layer 30, the intermediate layer 40a made of a spin quenching layer is interposed between the magnetization rotation layer 50 and the magnetic recording layer 30, and the effect of spin transfer torque is not exerted on each other. Hence the magnetization 32 has a good reversal efficiency and controllability. This allows increased reversal rate and reduced variation in magnetization reversal without degrading thermal fluctuation resistance and MR (magnetoresistive effect) characteristics. Furthermore, the value of write current can be also reduced. If the intermediate layer 40a is made of a spin conduction layer as described later, a control of the magnetization of the magnetization rotation layer 50 becomes difficult and the magnetic recording layer 30 becomes less stable.

Next, elements constituting the magnetic recording device of this embodiment are described in detail.

For the magnetic pinned layers 10a, 10b, one of a magnetic layer with a magnetization fixed generally parallel to the film plane and a magnetic layer with a magnetization fixed generally perpendicular to the film plane can be suitably selected in accordance with characteristics requirements. For the magnetic recording layer 30 and the magnetization rotation layer 50, one of a magnetic layer with a magnetization easy axis directed generally parallel to the film plane and a magnetic layer with a magnetization easy axis directed generally perpendicular to the film plane can be suitably selected in accordance with characteristics requirements.

The magnetic pinned layer 10a, 10b, the magnetic recording layer 30, or the magnetization rotation layer 50 made of a magnetic layer with a magnetization easy axis directed generally perpendicular to the film plane can be made of an alloy in which at feast one element selected from the group consisting of iron (Fe), cobalt (Co), nickel (Ni), manganese (Mn), and chromium (Cr) is combined with at least one element selected from the group consisting of platinum (Pt), palladium (Pd), iridium (Ir), ruthenium (Ru), and rhodium (Rh). The characteristics thereof can be adjusted by the composition and/or heat treatment of constituent magnetic materials. Alternatively, these layers can be made of an amorphous alloy of rare earth and transition metal such as TbFeCo and GdFeCo, or a laminated structure of Co/Pt or Co/Pd.

As another example of magnetic films having a magnetization easy axis directed generally perpendicular to the film plane, stacked structures having alloy films having showing a perpendicular magnetization based on ordered alloys such as FePt, FeCoPt, FePd and CoPd, and a very thin layer of CoFeB can be used. A single layer of CoFeB has a magnetization easy axis parallel to a film plane, however, the magnetization easy axis of the CoFeB becomes perpendicular to the film plane if it is stacked with a perpendicular magnetization film.

The magnetic pinned layer 10a, 10b, the magnetic recording layer 30, or the magnetization rotation layer 50 made of a magnetic layer with a magnetization easy axis directed generally perpendicular to the film plane is not limited to these continuous magnetic materials, but can be a composite structure in which fine particles made of a magnetic material are precipitated as a matrix in a nonmagnetic material, or covered with a nonmagnetic material (fine magnetic material, described later). Such composite structures illustratively include the so-called "granular magnetic material" and "core shell structure". The composite structure containing fine particles is suitable for downscaling the device, and hence suitable for increasing the packaging density. The magnetic fine particle has a cylindrical or spherical shape. With regard to the composite structure, in the case where the nonmagnetic material is made of an oxide-based high-resistance material such as $Al_2O_{3-x}$, $MgO_{1-x}$, $SiO_x$, $ZnO_x$, and $TiO_x$, the spin injection current serving as a write current concentrates on fine particles, which allows magnetization reversal at a low current density. In particular, if the nonmagnetic material used is the same as the material of the nonmagnetic barrier layer 20, crystal control and magnetic anisotropy control of fine particles are facilitated.

The magnetic pinned layer 10a, 10b, the magnetic recording layer 30, or the magnetization rotation layer 50 made of a magnetic layer with a magnetization easy axis directed generally parallel to the film plane is illustratively made of a magnetic metal containing at least one element selected from the group consisting of iron (Fe), cobalt (Co), nickel (Ni), manganese (Mn), and chromium (Cr).

In the case where the above magnetic materials are used for magnetic layers, the frequency of the radio-frequency magnetic field generated from the magnetization rotation layer 50 can be tuned by adjusting the magnetic anisotropy and saturation magnetization. However, the magnetic anisotropy Ku of the magnetic recording layer 30 preferably satisfies the condition of $KuV/kT>30$ from the viewpoint of recording retention.

Alternatively, the magnetic layer of the magnetic pinned layer 10a, 10b, the magnetic recording layer 30, or the magnetization rotation layer 50 can be a laminated ferri layer. This is intended to increase the oscillation frequency of the magnetization rotation layer 50, or efficiently pin the magnetization of the magnetic pinned layer 10a, 10b. Furthermore, a laminated structure of different magnetic layers can also be used to improve characteristics. Moreover, it is also possible to use a lamination in which a magnetic layer with a magnetization easy axis directed generally parallel to the film plane is laminated with a magnetic layer with a magnetization easy axis directed generally perpendicular to the film plane.

The thickness of the magnetic recording layer 30 or the magnetization rotation layer 50 is preferably in the range of 1 to 15 nm (except the thickness of the nonmagnetic layer in the case of a laminated film). This is intended to induce the magnetization reversal of the magnetic recording layer 30 and the precession of the magnetization rotation layer 50 without compromising device characteristics.

The barrier layer 20 can be made of an insulating material serving as a tunnel barrier layer for producing a large reproduction signal output by the TMR (tunneling magnetoresistive) effect at the time of reading. Specifically, the nonmagnetic barrier layer can be made of an oxide, nitride, or fluoride containing at least one element selected from the group consisting of aluminum (Al), titanium (Ti), zinc (Zn), zirconium (Zr), tantalum (Ta), cobalt (Co), nickel (Ni), silicon (Si), magnesium (Mg), and iron (Fe).

In particular, the nonmagnetic barrier layer is preferably made of an insulator such as alumina ($Al_2O_3$), magnesium oxide (MgO), $SiO_{2-x}$, Si—O—N, Ta—O, Al—Zr—O, $ZnO_x$, and $TiO_x$, or a semiconductor having a large energy gap (such as GaAlAs). Furthermore, the nonmagnetic barrier layer can be made of a nanocontact MR (magnetoresistive effect) material in which a magnetic material is inserted into pinholes provided in an insulator, or a CCP (confined current pass)-CPP (current perpendicular to plane)-MR material in which copper (Cu) is inserted into pinholes provided in an insulator, to produce a large reproduction signal output.

In the case where the nonmagnetic barrier layer is a tunnel barrier layer, its thickness is preferably in the range of e.g. approximately 0.2 to 2.0 nm to produce a large reproduction signal output. Likewise, in the case where the nonmagnetic barrier layer is a nanocontact MR material, its thickness is preferably in the range of e.g. approximately 0.4 to 40 nm to produce a large reproduction signal output.

FIG. 4 is a schematic view illustrating the intermediate layer disposed between the magnetic recording layer and the magnetization rotation layer according to this embodiment. More specifically, FIG. 4A is a schematic view illustrating an intermediate layer made of a single layer film. FIG. 4B is a schematic view illustrating an intermediate layer made of a laminated film in which a copper (Cu) layer is laminated on one side. FIG. 4C is a schematic view illustrating an intermediate layer made of a laminated film in which a copper (Cu) layer is laminated on both sides. FIG. 4D is a schematic view illustrating an intermediate layer made of a laminated film in which an oxide is laminated on one side. FIG. 4E is a schematic view illustrating an intermediate layer made of a laminated film in which an oxide is laminated on both sides.

In the case where the magnetic recording layer 30 is adjacent to the magnetization rotation layer 50 across the intermediate layer 40a like the magnetic recording device shown in FIG. 1, the intermediate layer 40a is made of a layer (spin quenching layer) 80 including a nonmagnetic material or structure in which the spin polarization of electrons passing therethrough is attenuated. In studying spin injection induced magnetization reversal for magnetic recording devices having a layered structure including CoFe/Ru/CoFe, the inventors have found that ruthenium (Ru) has an extremely short effective spin diffusion length of several nm, and found the effect of quenching the spin polarization of electrons passing through a ruthenium (Ru) layer.

This spin quenching effect is caused by quenching of spin inside the ruthenium (Ru) layer and the spin-flip effect at the interface between the ruthenium (Ru) layer and its adjacent layer. Materials of the intermediate layer 40a that provide such a spin quenching effect include a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V), or an alloy containing at least one element thereof.

The thickness of the intermediate layer 40a is preferably 1.4 nm or more and 20 nm or less. If it is 1.4 nm or more, no interlayer magnetic coupling occurs between the magnetic recording layer 30 and the magnetization rotation layer 50, and it is possible to quench the spin polarization of conduction electrons passing through the inside and interface of the intermediate layer 40a. Furthermore, the precession of the magnetization rotation layer 50 can be prevented from varying with the magnetization orientation of the magnetic recording layer 30. On the other hand, the thickness above 20 nm is undesirable because the pillar formation in the multilayer film is made difficult.

Besides the single layer film 80 described above, the intermediate layer 40a can be a laminated film in which a copper (Cu) layer 90 is laminated on one side or both sides of a layer made of a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V), or an alloy containing at least one element thereof.

Furthermore, besides the single layer film 80 described above, the intermediate layer 40a can be a laminated film in which an oxide 100 containing at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru) is laminated on one side or both sides of a layer made of a metal selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V), or an alloy containing at least one element thereof.

If the intermediate layer 40a is made of a laminated film in which a copper (Cu) layer 90 is laminated, the motion of the magnetization of the magnetic recording layer 30 or the magnetization rotation layer 50 can be made smooth. If the intermediate layer 40a is made of a laminated film in which the above oxide 100 is laminated, the oxide 100 serves as a layer for reflecting spin-polarized electrons. It is expected that this results in decreasing the reversal current density for spin injection induced magnetization reversal.

It is preferable that the thickness of the copper (Cu) layer 90 and the above oxide 100 be e.g. approximately 0.6 to 10 nm in favor of not interfering with the magnetization reversal of the magnetic recording layer 30 and the precession of the magnetization rotation layer 50 and applying the alternating magnetic field generated by the precession of the magnetization rotation layer 50 to the magnetic recording layer 30.

The intermediate layer 40b is made of a nonmagnetic material. The material of the intermediate layer 40b can be any of metal, insulator, and semiconductor serving as a spin conduction layer, and can be either a low-resistance material or a high-resistance material.

The low-resistance material can be copper (Cu), gold (Au), silver (Ag), or aluminum (Al), or a metal containing at least one element selected from the group consisting of copper (Cu), gold (Au), silver (Ag), and aluminum (Al) or an alloy thereof. The thickness of the intermediate layer 40b made of such a low-resistance nonmagnetic material can be e.g. approximately 2 to 60 nm to achieve the effect of magnetization rotation by angular momentum transfer of electron spin.

The high-resistance material can be an insulator made of an oxide, nitride, or fluoride containing at least one element selected from the group consisting of aluminum (Al), titanium (Ti), tantalum (Ta), cobalt (Co), nickel (Ni), silicon (Si), magnesium (Mg), and iron (Fe). This insulator is illustratively alumina ($Al_2O_{3-x}$), magnesium oxide (MgO), $SiO_2$, Si—O—N, Ta—O, or Al—Zr—O. Alternatively, the high-resistance material can also be a semiconductor having a large energy gap such as GaAlAs.

The intermediate layer 40b can also be made of a nanocontact MR material in which a magnetic layer is inserted into pinholes provided in an insulator, or a CCP-CPP-MR (magnetoresistive effect) material in which Cu is inserted into such pinholes, to achieve the effect of magnetization rotation. In the case of the former insulator for providing the tunnel magnetoresistive effect, it is preferable that the thickness of the intermediate layer 40b be e.g. approximately 0.2 to 2 nm in view of signal reproduction. In the case of the latter nanocontact MR or CCP-CPP-MR, it is preferable that the thickness of the intermediate layer 40b be in the range of e.g. approximately 0.4 to 40 nm.

With regard to the cross-sectional shape of the magnetic recording device according to this embodiment, the dimension in the direction generally parallel to the film plane (generally horizontal dimension in this figure) is the same for all the layers in the magnetic recording device of FIG. 1, but is not limited thereto. The dimension of each layer may be different for making interconnection or controlling the magnetization direction. For example, the cross section can be shaped like a trapezoid in which the dimension in the direction generally parallel to the film plane (generally horizontal dimension in this figure) continuously decreases toward the upper layer. Alternatively, the dimension in the direction generally parallel to the film plane (generally horizontal dimension in this figure) can be discontinuous between the layers (for example, a convex cross section). Even in these cases, there is no problem about the effect of this embodiment. However, it is preferable that the dimension of the magnetization rotation layer 50 in the direction generally parallel to the film plane (generally horizontal dimension in this figure) be larger than that of the magnetic recording layer 30 because, in this structure, the radio-frequency magnetic field can be applied more effectively in the direction of the magnetization hard axis of the magnetic recording layer 30.

The planar shape of the magnetic recording device according to this embodiment, in the case of the magnetic recording layer 30 with a magnetization easy axis directed generally parallel to the film plane, is preferably a rectangle, a horizontally long (vertically long) hexagon, an ellipse, a rhombus, or a parallelogram having a vertical-to-horizontal ratio in the range of e.g. approximately 1:1.2 to 1:5, that is, in terms of horizontal/vertical aspect ratio, in the range of e.g. approximately 1.2 to 5. In the case of the magnetic recording layer 30 with a magnetization easy axis directed generally perpendicular to the film plane, the horizontal/vertical aspect ratio is preferably in the range of e.g. approximately 1 to 10. With regard to the dimensions in the planar shape of the magnetic layer, it is preferable that the side along the minor axis be in the range of e.g. approximately 5 to 300 nm.

In the following, variations of this embodiment are described with reference to specific examples.

Figure 5:
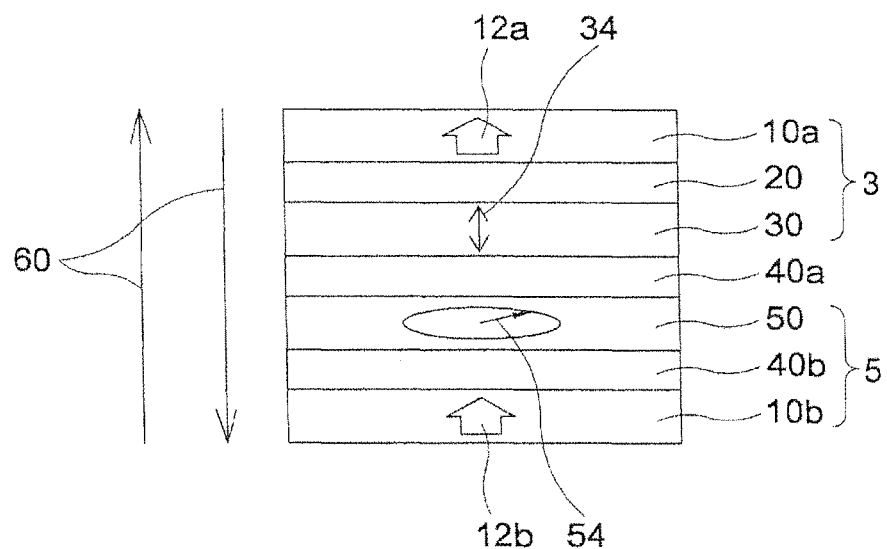
FIG. 5 is a schematic view illustrating the cross-sectional structure of a magnetic recording device according to a specific example of this embodiment.

FIG. 5 is a schematic view illustrating the cross-sectional structure of a magnetic recording device according to a specific example of this embodiment.

The magnetic recording device of this specific example is different from the magnetic recording device of FIG. 1 in that the magnetization 12a of the magnetic pinned layer 10a is fixed generally perpendicular to the film plane, and that the magnetization easy axis 34 of the magnetic recording layer 30 is generally perpendicular to the film plane. The lamination order of the layers of this specific example is the same as that of the magnetic recording device of FIG. 1. Like the magnetic recording device of FIG. 1, the intermediate layer 40a disposed between the magnetic recording section 3 and the magnetization oscillator 5 comprises a spin quenching layer, and can be made of the material described above. An electron current 60 can be passed through the magnetic recording device shown in FIG. 5 using electrodes, not shown, connected to the magnetic pinned layers 10a, 10b.

In the magnetic recording device of this specific example, in the case where an electron current 60 flows from the magnetic pinned layer 10a to the magnetic recording layer 30 in FIG. 5 (downward in this figure), electrons passing through the magnetic pinned layer 10a take on spin parallel to the magnetization 12a. Hence the magnetic recording layer 30 takes on a magnetization 32 parallel (upward in this figure) to the magnetization 12a.

Simultaneously with this write operation, in the case where the electron current 60 flows from the magnetization rotation layer 50 to the magnetic pinned layer 10b (downward in this figure), electrons with spin parallel to the magnetization 12b of the magnetic pinned layer 10b pass through the magnetic pinned layer 10b, whereas electrons with spin antiparallel to the magnetization 12b are reflected at the interface between the magnetic pinned layer 10b and the intermediate layer 40b. When these reflected electrons flow into the magnetization rotation layer 50, the magnetization of the magnetization rotation layer 50 undergoes precession by the effect of the electron spin. Consequently, a radio-frequency magnetic field is generated from the magnetization rotation layer 50.

On the other hand, the electron current 60 that has passed through the magnetic recording layer 30 of the magnetic recording section 3 also acts on the magnetization of the magnetization rotation layer 50 of the magnetization oscillator 5. However, the intermediate layer 40a disposed between the magnetic recording layer 30 and the magnetization rotation layer 50 is a spin quenching layer, and hence the spin information of electrons traversing this layer is lost. Thus, the magnetization of the magnetization rotation layer 50 can be controlled independently of the effect of the spin transfer torque from the magnetic recording layer 30.

In contrast, in the case where an electron current 60 flows from the magnetic recording layer 30 to the magnetic pinned layer 10a in FIG. 5 (upward in this figure), electrons with spin parallel to the magnetization 12a of the magnetic pinned layer 10a pass through the magnetic pinned layer 10a, whereas electrons with spin antiparallel to the magnetization 12a are reflected at the interface between the magnetic pinned layer 10a and the barrier layer 20. When these reflected electrons flow into the magnetic recording layer 30, the magnetic recording layer 30 takes on a magnetization 32 antiparallel (downward in this figure) to the magnetization 12a by the effect of the electron spin.

Simultaneously with this write operation, in the case where the electron current 60 flows from the magnetic pinned layer 10b to the magnetization rotation layer 50 (upward in this figure), electrons passing through the magnetic pinned layer 10b take on spin parallel to the magnetization 12b. When these electrons flow into the magnetization rotation layer 50, the magnetization of the magnetization rotation layer 50 undergoes precession by the effect of the electron spin. Consequently, a radio-frequency magnetic field is generated from the magnetization rotation layer 50.

On the other hand, part of the electron current 60 that has flowed from the magnetization rotation layer 50 of the magnetization oscillator 5 to the magnetic recording layer 30 of the magnetic recording section 3 is reflected at the surface of the magnetic recording layer 30 and also acts on the magnetization of the magnetization rotation layer 50 of the magnetization oscillator 5. However, the intermediate layer 40a disposed between the magnetic recording layer 30 and the magnetization rotation layer 50 includes a material or structure such that the spin polarization of electrons traversing the intermediate layer 40a is quenched, and hence the spin information is lost. Thus, the magnetization of the magnetization rotation layer 50 can be controlled independently of the effect of the spin transfer torque from the magnetic recording layer 30.

The frequency of the radio-frequency magnetic field is, like the foregoing, approximately 1 to 60 GHz, for example. This radio-frequency magnetic field has a component perpendicular to the magnetization easy axis of the magnetic recording layer 30, that is, in the direction of its magnetization hard axis. Hence, the radio-frequency magnetic field generated from the magnetization rotation layer 50 is applied in the direction of the magnetization hard axis of the magnetic recording layer 30. When the radio-frequency magnetic field generated from the magnetization rotation layer 50 is applied in the direction of the magnetization hard axis of the magnetic recording layer 30, the magnetization 32 of the magnetic recording layer 30 becomes very easy to be reversed.

In the magnetic recording device of this specific example, the magnetization easy axis 34 of the magnetic recording layer 30 is generally perpendicular to the film plane. Thus the radio-frequency magnetic field generated from the magnetization rotation layer 50 is constantly applied in the direction of the magnetization hard axis of the magnetic recording layer 30. Hence the magnetization 32 of the magnetic recording layer 30 can be reversed more efficiently than in the magnetic recording device of FIG. 1.

Figure 6:
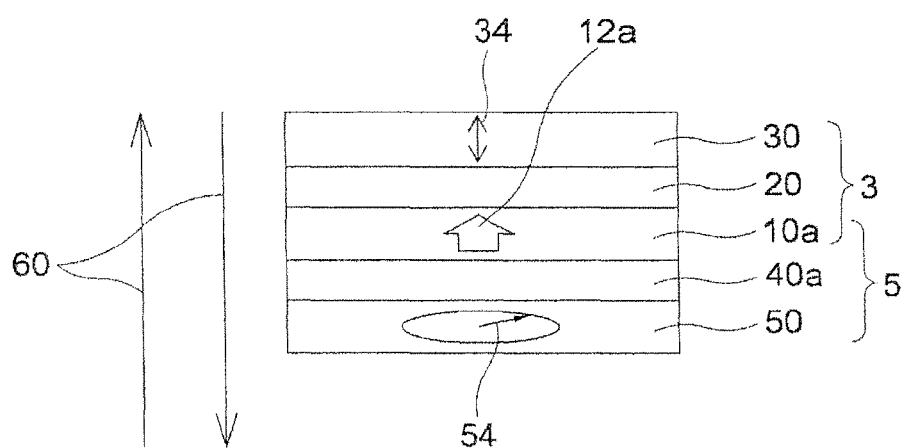
FIG. 6 is a schematic view illustrating the cross-sectional structure of a magnetic recording device according to another specific example of this embodiment.

FIG. 6 is a schematic view illustrating the cross-sectional structure of a magnetic recording device according to another specific example of this embodiment.

The magnetic recording device of this specific example comprises a magnetic recording layer 30 with a magnetization easy axis 34 directed generally perpendicular to the film plane, a magnetic pinned layer 10a with a magnetization 12a fixed generally perpendicular to the film plane, a barrier layer 20 disposed between the magnetic recording layer 30 and the magnetic pinned layer 10a, a magnetization rotation layer 50 with a magnetization easy axis 54 directed generally parallel to the film plane, and an intermediate layer 40a disposed between the magnetic pinned layer 10a and the magnetization rotation layer 50. In the magnetic recording device of this specific example, the magnetization rotation layer 50, the intermediate layer 40a, the magnetic pinned layer 10a, the barrier layer 20, and the magnetic recording layer 30 are laminated in this order. In contrast to the magnetic recording device shown in FIGS. 1 and 5, the intermediate layer 40a of this specific example is made of a so-called spin transfer layer, which includes a material described later that can transfer spin information. An electron current 60 can be passed through the magnetic recording device shown in FIG. 6 using electrodes, not shown, connected to the magnetic recording layer 30 and the magnetization rotation layer 50.

The magnetic pinned layer 10a serves to determine the orientation of the magnetization 32 of the magnetic recording layer 30, and also serves to cause the magnetization 54 of the magnetization rotation layer 50 to undergo precession. That is, the magnetic pinned layer 10a simultaneously serves as the magnetic pinned layer of both the magnetic recording section 3 and the magnetization oscillator 5. Such a structure simplifies the structure of the magnetic recording device. Thus the overall thickness can be decreased, and the magnetic recording device can be downsized. Furthermore, the manufacturing yield is improved.

In the magnetic recording device shown in FIG. 6, the intermediate layer 40a is made of a so-called spin transfer layer, which includes a material that can transfer spin information. Preferably, specific materials for the intermediate layer 40a include a metal selected from the group consisting of copper (Cu), gold (Au), silver (Ag), and aluminum (Al) or an alloy containing at least one element thereof, or an insulator made of an oxide, nitride, or fluoride containing at least one element selected from the group consisting of aluminum (Al), titanium (Ti), tantalum (Ta), cobalt (Co), nickel (Ni), silicon (Si), magnesium (Mg), and iron (Fe).

In the case of the above nonmagnetic metals, the thickness of the intermediate layer 40a can be e.g. approximately 2 to 60 nm to achieve the effect of magnetization rotation by the angular momentum of electron spin. Examples of the above insulator also include alumina ($Al_2O_{3-x}$), magnesium oxide (MgO), $SiO_2$, Si—O—N, Ta—O, and Al—Zr—O, as well as a semiconductor having a large energy gap such as GaAlAs. In such cases, it is preferable that the thickness of the intermediate layer 40a be in the range of e.g. approximately 0.6 to 2 nm to achieve sufficient conductivity.

In the case where an electron current 60 flows from the magnetic recording layer 30 to the magnetic pinned layer 10a in FIG. 6 (downward in this figure), electrons with spin parallel to the magnetization 12a of the magnetic pinned layer 10a pass through the magnetic pinned layer 10a, whereas electrons with spin antiparallel to the magnetization 12a are reflected at the interface between the magnetic pinned layer 10a and the barrier layer 20. When these reflected electrons flow into the magnetic recording layer 30, the magnetic recording layer 30 takes on a magnetization 32 antiparallel (downward in this figure) to the magnetization 12a by the effect of the electron spin.

Simultaneously with this write operation, the electron current 60 flows from the magnetic pinned layer 10a to the magnetization rotation layer 50 (downward in this figure), and hence electrons passing through the magnetic pinned layer 10a take on spin parallel to the magnetization 12a. When these electrons flow into the magnetization rotation layer 50, the magnetization of the magnetization rotation layer 50 undergoes precession by the effect of the electron spin. Consequently, a radio-frequency magnetic field is generated from the magnetization rotation layer 50.

In contrast, in the case where an electron current 60 flows from the magnetic pinned layer 10a to the magnetic recording layer 30 in FIG. 6 (upward in this figure), electrons passing through the magnetic pinned layer 10a take on spin parallel to the magnetization 12a. Hence the magnetic recording layer 30 takes on a magnetization 32 parallel (upward in this figure) to the magnetization 12a.

Simultaneously with this write operation, the electron current 60 flows from the magnetization rotation layer 50 to the magnetic pinned layer 10a (upward in this figure), and hence electrons with spin parallel to the magnetization 12a of the magnetic pinned layer 10a pass through the magnetic pinned layer 10a, whereas electrons with spin antiparallel to the magnetization 12a are reflected at the interface between the magnetic pinned layer 10a and the intermediate layer 40a. When these reflected electrons flow into the magnetization rotation layer 50, the magnetization of the magnetization rotation layer 50 undergoes precession by the effect of the electron spin. Consequently, a radio-frequency magnetic field is generated from the magnetization rotation layer 50.

The frequency of the radio-frequency magnetic field is, like the foregoing, approximately 1 to 60 GHz, for example. This radio-frequency magnetic field has a component perpendicular to the magnetization easy axis of the magnetic recording layer 30, that is, in the direction of its magnetization hard axis. Hence, the radio-frequency magnetic field generated from the magnetization rotation layer 50 is applied in the direction of the magnetization hard axis of the magnetic recording layer 30. When the radio-frequency magnetic field generated from the magnetization rotation layer 50 is applied in the direction of the magnetization hard axis of the magnetic recording layer 30, the magnetization 32 of the magnetic recording layer 30 becomes very easy to be reversed.

In the magnetic recording device of this specific example, like the magnetic recording device of FIG. 5, the magnetization easy axis 34 of the magnetic recording layer 30 is generally perpendicular to the film plane. Thus the radio-frequency magnetic field generated from the magnetization rotation layer 50 is constantly applied in the direction of the magnetization hard axis of the magnetic recording layer 30. Hence the magnetization 32 of the magnetic recording layer 30 can be reversed more efficiently than in the magnetic recording device of FIG. 1.

It is noted that the magnetic recording layer 30 is not limited to being provided with a single magnetic pinned layer as in the magnetic recording device shown in FIG. 6. In a structure (dual pin structure) where another magnetic pinned layer is formed on the magnetic recording layer 30 shown in FIG. 6 via another intermediate layer, the critical reversal current for spin injection induced magnetization reversal can be decreased.

Figure 7:
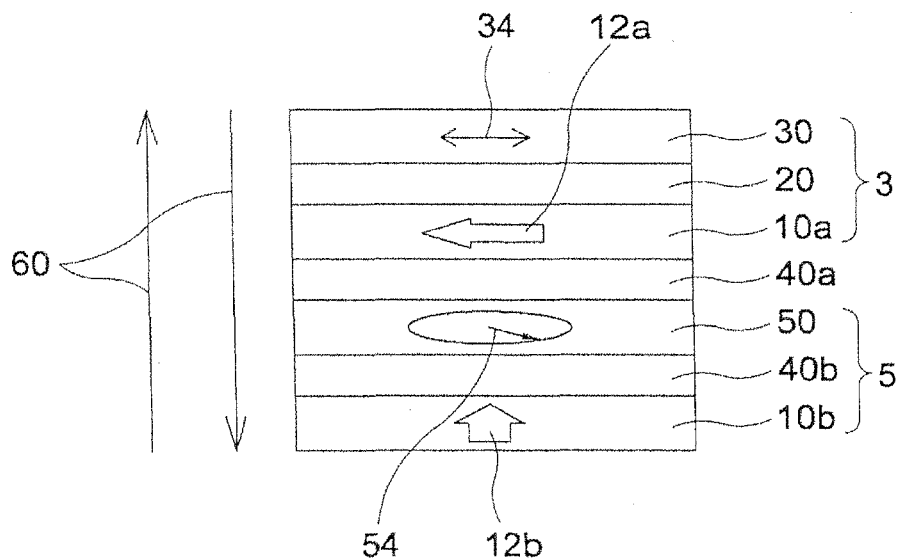
FIG. 7 is a schematic view illustrating the cross-sectional structure of a magnetic recording device according to still another specific example of this embodiment.

FIG. 7 is a schematic view illustrating the cross-sectional structure of a magnetic recording device according to still another specific example of this embodiment.

In the magnetic recording device of this specific example, the lamination order in the magnetic recording section 3 is different from that in the magnetic recording device of FIG. 1. In the magnetic recording section 3 of the magnetic recording device of this specific example, the magnetic pinned layer 10a, the barrier layer 20, and the magnetic recording layer 30 are laminated in this order. In contrast, in the magnetic recording section 3 of the magnetic recording device of FIG. 1, the magnetic recording layer 30, the barrier layer 20, and the magnetic pinned layer 10a are laminated in this order. Between the magnetic pinned layer 10a and the intermediate layer 40a, an antiferromagnetic layer, not shown, can be disposed to reinforce the magnetization pinning of the magnetic pinned layer 10a. An electron current 60 can be passed through the magnetic recording device of this specific example using electrodes, not shown, connected to the magnetic recording layer 30 and the magnetic pinned layer 10b. In this structure, the intermediate layer 40a can be optionally either a spin quenching layer or a spin transfer layer.

In the magnetic recording device of this specific example, in the case where an electron current 60 flows from the magnetic recording layer 30 to the magnetic pinned layer 10a in FIG. 7 (downward in this figure), electrons with spin parallel to the magnetization 12a of the magnetic pinned layer 10a pass through the magnetic pinned layer 10a, whereas electrons with spin antiparallel to the magnetization 12a are reflected at the interface between the magnetic pinned layer 10a and the barrier layer 20. When these reflected electrons flow into the magnetic recording layer 30, the magnetic recording layer 30 takes on a magnetization 32 antiparallel (rightward in this figure) to the magnetization 12a by the effect of the electron spin.

Simultaneously with this write operation, in the case where the electron current 60 flows from the magnetization rotation layer 50 to the magnetic pinned layer 10b (downward in this figure), electrons with spin parallel to the magnetization 12b of the magnetic pinned layer 10b pass through the magnetic pinned layer 10b, whereas electrons with spin antiparallel to the magnetization 12b are reflected at the interface between the magnetic pinned layer 10b and the intermediate layer 40b. When these reflected electrons flow into the magnetization rotation layer 50, the magnetization of the magnetization rotation layer 50 undergoes precession by the effect of the electron spin. Consequently, a radio-frequency magnetic field is generated from the magnetization rotation layer 50.

In contrast, in the case where an electron current 60 flows from the magnetic pinned layer 10a to the magnetic recording layer 30 in FIG. 7 (upward in this figure), electrons passing through the magnetic pinned layer 10a take on spin parallel to the magnetization 12a. Hence the magnetic recording layer 30 takes on a magnetization 32 parallel (leftward in this figure) to the magnetization 12a.

Simultaneously with this write operation, in the case where the electron current 60 flows from the magnetic pinned layer 10b to the magnetization rotation layer 50 (upward in this figure), electrons passing through the magnetic pinned layer 10b take on spin parallel to the magnetization 12b. When these electrons flow into the magnetization rotation layer 50, the magnetization of the magnetization rotation layer 50 undergoes precession by the effect of the electron spin. Consequently, a radio-frequency magnetic field is generated from the magnetization rotation layer 50.

The frequency of the radio-frequency magnetic field is, like the foregoing, approximately 1 to 60 GHz, for example. This radio-frequency magnetic field has a component perpendicular to the magnetization easy axis of the magnetic recording layer 30, that is, in the direction of its magnetization hard axis. Hence, the radio-frequency magnetic field generated from the magnetization rotation layer 50 is applied in the direction of the magnetization hard axis of the magnetic recording layer 30. When the radio-frequency magnetic field generated from the magnetization rotation layer 50 is applied in the direction of the magnetization hard axis of the magnetic recording layer 30, the magnetization 32 of the magnetic recording layer 30 becomes very easy to be reversed.

In the magnetic recording device of this specific example, the magnetic recording layer 30 is located more distant from the magnetization rotation layer 50 than in the magnetic recording device of FIG. 1. However, also in the magnetic recording device of this specific example, the radio-frequency magnetic field generated from the magnetization rotation layer 50 is applied in the direction of the magnetization hard axis of the magnetic recording layer 30, and advantageously, the magnetization 32 of the magnetic recording layer 30 becomes very easy to be reversed.

Next, a description is given of a simulation of the magnetization reversal of the magnetic recording layer performed on the magnetic recording device of this embodiment.

Figure 8:
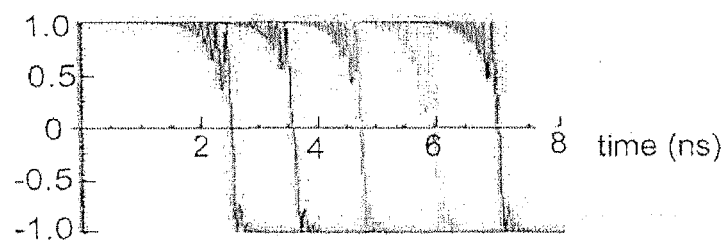
FIG. 8 is a graph illustrating the temporal variation of magnetization reversal.

FIG. 8 is a graph illustrating the temporal variation of magnetization reversal in the case where writing is performed without applying a radio-frequency magnetic field to the magnetic recording layer.

Figure 9:
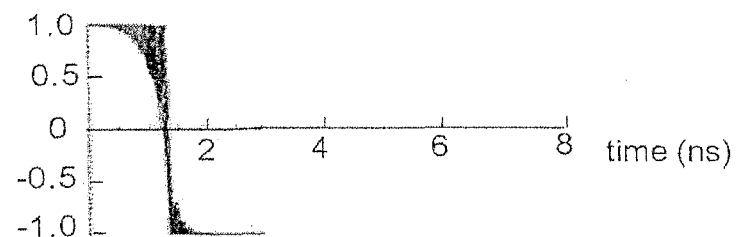
FIG. 9 is a graph illustrating the temporal variation of magnetization reversal.

FIG. 9 is a graph illustrating the temporal variation of magnetization reversal in the case where writing is performed while applying a radio-frequency magnetic field to the magnetic recording layer.

FIG. 10 is a graph illustrating the temporal variation of magnetic reversal in the case where writing is performed while applying a radio-frequency magnetic field having different frequencies to the magnetic recording layer. More specifically, FIG. 10A shows the case where the frequency is 0.1 GHz, FIG. 10B shows the case where the frequency is 2 GHz, FIG. 10C shows the case where the frequency is 4 GHz, FIG. 10D shows the case where the frequency is 10 GHz, and FIG. 10E shows the case where the frequency is 15 GHz.

The horizontal axis in FIGS. 8 to 10 represents time required from passing a write current until magnetization reversal. The vertical axis in FIGS. 8 to 10 represents the orientation of the magnetization of the magnetic recording layer. That is, the graph indicates that magnetization reversal occurs when the value on the vertical axis varies from 1.0 to −1.0.

This simulation is based on the Landau-Lifshitz-Gilbert equation including spin transfer torque given by the following equation, where 14 denotes the vector of the magnetization 32 of the magnetic recording layer 30, and m and $m_{pin}$ denote the unit vector along the magnetization 32 of the magnetic recording layer 30 and the magnetization 12a of the magnetic pinned layer 10a, respectively. $H_{eff}$ is the effective magnetic field applied to the magnetic recording layer 30, to which the effect of the radio-frequency magnetic field was added.

$$dM/dt = -\gamma M \times H_{eff} + am \times (dM/dt) + (2\mu_B/V)(I/e)gm \times (m_{pin} \times m)$$

The basic structure of the magnetic recording section 3 in this simulation is: magnetic recording layer 30/barrier layer 20/magnetic pinned layer 10a. The magnetic recording layer 30 is made of cobalt (Co) and has a thickness of 2.5 nm. The magnetic pinned layer 10a is made of cobalt (Co) and has a thickness of 40 nm. The magnetic recording layer 30 has an elliptical shape of approximately 120 nm×90 nm. The magnetization easy axis of the magnetic recording layer 30 is directed generally parallel to the film plane, and in particular, generally in the direction of the ellipse major axis. The anisotropy magnetic field was assumed to have a typical value of 150 Oe (oersted). These parameters were selected on the basis of the result of preliminary experiments.

The critical reversal current density (Jc) for this magnetic recording device is calculated to be $2 \times 10^7$ A/cm$^2$. However, this critical reversal current density (Jc) is a current value needed in the case where a quasi-static current is passed. If the pulse width decreases, a reversal current density more than several times the critical reversal current density (Jc) is needed as described above.

In the simulation shown in FIG. 8, magnetization reversal (writing) was performed by a current of 2.86 times the critical reversal current density (Jc) without applying a radio-frequency magnetic field to the magnetic recording layer 30. FIG. 8 includes a plurality of curves, because the results for different initial angles of the magnetization 32 of the magnetic recording layer 30 are superimposed. The initial angle of the magnetization 32 of the magnetic recording layer 30 was distributed to a maximum of 0.57 degrees with respect to the magnetization easy axis. It can be seen that, although a current of 2.86 times the critical reversal current density (Jc) is passed perpendicular to the magnetic recording device, the reversal time is varied with the initial angle of the magnetization 32 of the magnetic recording layer 30. Hence, in the case where the write current has a pulse width of approximately 5 ns, the reversal probability is approximately ½. This simulation result shows that, for a pulse width of e.g. approximately 5 ns, a larger write current is needed to achieve a reversal probability of 1 without applying a radio-frequency magnetic field to the magnetic recording layer 30.

In the simulation shown in FIG. 9, magnetization reversal (writing) was performed by a current of 2.86 times the critical reversal current density (Jc) like the simulation shown in FIG. 8, while applying a radio-frequency magnetic field having an amplitude of 3 Oe and a frequency of 4.75 GHz to the magnetic recording layer 30 in the direction of its magnetization hard axis. Like the simulation shown in FIG. 8, the initial angle of the magnetization 32 of the magnetic recording layer 30 was distributed to a maximum of 0.57 degrees with respect to the magnetization easy axis. Also in this figure, the results for different initial angles are superimposed. It can be seen that, in contrast to the simulation result shown in FIG. 8, as a consequence of applying a radio-frequency magnetic field to the magnetic recording layer 30, the magnetization is reversed in a time period of approximately 1.3 ns irrespective of the initial angle of the magnetization 32 of the magnetic recording layer 30. This indicates that rapid magnetization reversal with low variation can be achieved, allowing substantial reduction of recording current density.

In the simulation shown in FIG. 10, magnetization reversal (writing) was performed by a current of 2.86 times the critical reversal current density (Jc) like the simulation shown in FIG. 8, while applying a radio-frequency magnetic field having an amplitude of 7.5 Oe to the magnetic recording layer 30 in the direction of its magnetization hard axis. It can be seen from this simulation result that the reversal time is varied with the initial angle of the magnetization 32 of the magnetic recording layer 30 in any of the cases where the frequency of the radio-frequency magnetic field is 0.1 GHz, 2 GHz, 10 GHz, and 15 GHz. In contrast, in the case where the frequency of the radio-frequency magnetic field is 4 GHz, it can be seen that the magnetization is reversed in a time period of approximately 0.9 ns irrespective of the initial angle of the magnetization 32 of the magnetic recording layer 30. That is, it turns out that a frequency of e.g. approximately 4 GHz, at which the magnetic recording layer 30 undergoes magnetic resonance, is preferable as a condition for realizing rapid magnetization reversal with low variation. It is noted that the frequency of magnetic resonance in a magnetic recording device can be determined by connecting the magnetic recording device to a network analyzer to characterize the response (transmittance or reflectance) of the magnetic recording device to radio frequencies.

FIG. 11 is a schematic illustration of the dependence of time required for magnetization reversal on frequency and radio-frequency magnetic field intensity in the case where writing is performed on the magnetic recording layer 30 with a magnetization easy axis directed generally perpendicular to the film plane while applying a radio-frequency magnetic field to the magnetic recording layer.

As the characteristics of the magnetic recording device, a perpendicular magnetic anisotropy (Ku) of $6.2\times10^6$ erg/cc and a magnetization (Ms) of 970 emu/cc were assumed. In this case, the anisotropy magnetic field (Hk) is 12.8 kOe, and the critical reversal current density (Jc) for DC current is $1.69\times10^6$ A/cm$^2$.

Like the simulations shown in FIGS. 8 to 10, the basic structure of the magnetic recording section 3 in this simulation is: magnetic recording layer 30/barrier layer 20/magnetic pinned layer 10*a*. Specifically, the structure FeXY/MgO/FeXY is assumed. X is at least one element selected from the group consisting of chromium (Cr), copper (Cu), cobalt (Co), nickel (Ni), and vanadium (V). Y is platinum (Pt) or palladium (Pd). It is noted that TMR (tunneling magnetoresistive effect) can be increased by interposing an interfacial layer made of FeX at the interface between FeXY and MgO.

A radio-frequency magnetic field at 1 to 7 GHz was applied to this magnetic recording device in the direction parallel to the film plane, that is, in the direction of the magnetization hard axis, to examine the behavior of magnetization reversal. The intensity of the radio-frequency magnetic field was varied as 260*e*, 640*e*, and 1280*e*. With regard to current, magnetization reversal (writing) was performed by a current of 1.64 times the critical reversal current density (Jo). Like the simulations shown in FIGS. 8 to 10, the reversal time is varied with the initial angle of the magnetization 32 of the magnetic recording layer 30. Among them, the longest reversal time is plotted with respect to the frequency of the radio-frequency magnetic field in FIG, 11.

In the vicinity of the zero frequency of the radio-frequency magnetic field, FIG. 11 shows reversal time for no radio-frequency magnetic field applied. It can be seen from this that the time required for reversal reaches approximately 20 ns in the case where no radio-frequency magnetic field is applied. It turns out from this result that, in the case where magnetization reversal (writing) is performed using a current pulse illustratively having a pulse width of approximately 8 ns and a current density of $2.77\times10^6$ A/cm$^2$, no magnetization reversal actually occurs without application of a radio-frequency magnetic field, whereas application of a radio-frequency magnetic field illustratively having a frequency of approximately 2.2 GHz and an intensity of approximately 0.2 to 1% of the anisotropy magnetic field (Hk) enables magnetization reversal with a reversal probability of 1. Furthermore, it turns out that the frequency out of the resonant condition is unfavorable even if the radio-frequency magnetic field has high intensity.

As described above, irrespective of whether the magnetization easy axis 34 of the magnetic recording layer 30 is parallel or perpendicular to the film plane, a radio-frequency magnetic field having a frequency similar to the magnetic resonance frequency of the magnetic recording layer 30 is applied in the direction of the magnetization hard axis of the magnetic recording layer 30, and thereby rapid magnetization reversal with low variation can be achieved, allowing substantial reduction of recording current density.

Next, this embodiment is described in more detail with reference to a working example.

FIG. 12 is a table showing the result of writing probability in this working example.

In this working example, a magnetic recording device having a structure similar to FIG. 1 was prototyped (sample number S1). The material and thickness of the layers of this magnetic recording device are as follows: antiferromagnetic layer (IrMn)/magnetic pinned layer 10*a* (CoFeB: 4 nm/Ru: 1 nm/CoFe: 4 nm)/barrier layer 20 (MgO: 1 nm)/magnetic recording layer 30 (CoFe: 1 nm/CoFeB: 1 nm) intermediate layer 10*a* (Ru: 6 nm)/magnetization rotation layer 50 (CoFe: 2 nm)/intermediate layer 40*b* (Cu: 6 nm)/magnetic pinned layer 10*b* (FePt: 10 nm). Furthermore, magnetic recording devices having layer structures R1 to R3 were prototyped as comparative examples. Thus, four samples were prepared in total. In the case of the magnetization 12*b* of the magnetic pinned layer 10*b* and/or the magnetization easy axis of the magnetization rotation layer 50 being generally perpendicular to the film plane, the magnetic pinned layer 10*b* was made of an FePt ordered alloy in common.

These samples are manufactured by the following procedure.

First, a lower electrode is formed on a wafer, which is then placed in an ultrahigh vacuum sputtering system. Next, a magnetic pinned layer 10b, an intermediate layer 40b, a magnetization rotation layer 50, an intermediate layer 40a, a magnetic recording layer 30, a barrier layer 20, a magnetic pinned layer 10a, and a cap layer, not shown, are laminated in this order on the lower electrode. The lower electrode can be illustratively made of an Au(001) or Pt(001) buffer layer.

The magnetic pinned layer 10b made of an FePt ordered alloy can be grown on the buffer layer, not shown, under substrate heating, for example. Then the substrate temperature is decreased to room temperature, and the intermediate layer 40b and the subsequent layers are formed. Then the cap layer, not shown, is grown. However, formation of the barrier layer 20 was followed by post-annealing at 300° C.

This substrate was placed in an in-field heat treatment furnace and subjected to heat treatment in a magnetic field at 270° C. for two hours to provide the antiferromagnetic layer with exchange bias capability.

Next, an EB (electron beam) resist is applied and subjected to EB exposure to form a mask. The mask is illustratively shaped like an ellipse of 70 nm×140 nm, and the longitudinal direction along its major axis is parallel to the direction of the magnetic anisotropy of the magnetic recording layer 30. Then an ion milling system is used to etch the magnetic recording layer 30, the magnetic pinned layers 10a, 10b, the nonmagnetic barrier layer 20, and the cap layer, not shown, located in the region not covered with the mask. Here, the etching amount can be accurately ascertained by introducing the sputtered particles into a differentially pumped quadrupole analyzer for mass spectrometry.

Subsequently, the mask is removed, and $SiO_2$ is formed to completely cover the magnetic recording device. Then the $SiO_2$ surface is planarized by ion milling to expose the upper surface of the cap layer, not shown, from $SiO_2$. Finally, an upper electrode is formed on the cap layer, not shown.

Using a current having a pulse width of 2 nsec, a write test was performed fifty times on the samples thus fabricated. FIG. 12 shows the result for writing probability in this test. The reversal probability was 1 for the sample Si, but 0.1 for the sample R1, exhibiting reversal variation. No reversal occurred in the samples R2, R3. It is clearly confirmed from this result that, according to this embodiment, variation in magnetization reversal is eliminated, allowing rapid magnetization reversal and reduction of magnetization reversal current. Furthermore, a similar trend was observed also for the nonmagnetic barrier layer made of $Al_2O_{3-x}$, $SiO_2$, $TiO_x$, and $ZnO_x$.

Next, a second embodiment of the invention is described.

Figure 13:
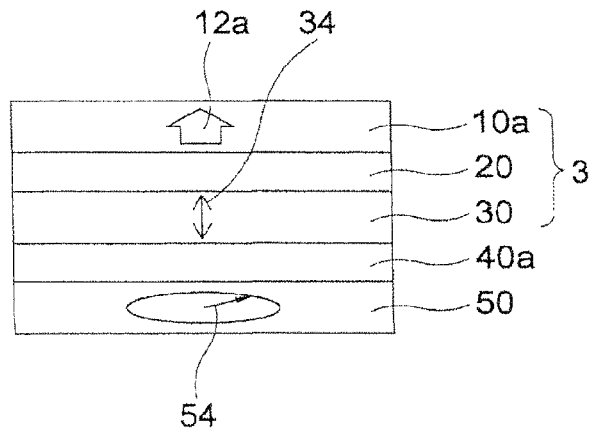
FIG. 13 is a schematic view illustrating a basic cross-sectional structure of a magnetic recording device according to a second embodiment of the invention.

FIG. 13 is a schematic view illustrating a basic cross-sectional structure of a magnetic recording device according to the second embodiment of the invention.

Figure 14:
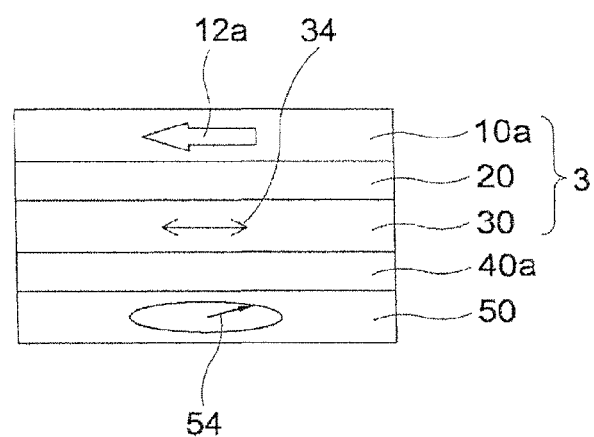
FIG. 14 is a schematic view illustrating another basic cross-sectional structure of a magnetic recording device according to the second embodiment of the invention.

FIG. 14 is a schematic view illustrating another basic cross-sectional structure of a magnetic recording device according to the second embodiment of the invention.

The magnetic recording device of this embodiment comprises a magnetic recording section 3, an intermediate layer 40a, and a magnetization rotation layer 50. In the magnetic recording device of FIG. 13, the magnetic recording section 3 includes a magnetic pinned layer 10a with a magnetization 12a fixed generally perpendicular to the film plane, a magnetic recording layer 30 with a magnetization easy axis 34 directed generally perpendicular to the film plane, and a barrier layer 20 disposed between the magnetic pinned layer 10a and the magnetic recording layer 30. In the magnetic recording device of FIG. 14, the magnetic recording section 3 includes a magnetic pinned layer 10a with a magnetization 12a fixed generally parallel to the film plane, a magnetic recording layer 30 with a magnetization easy axis 34 directed generally parallel to the film plane, and a barrier layer 20 disposed between the magnetic pinned layer 10a and the magnetic recording layer 30. As in the first embodiment, this laminated structure composed of the magnetic pinned layer 10a, the barrier layer 20, and the magnetic recording layer 30 is known as MTJ (magnetic tunnel junction).

In the magnetic recording device of this embodiment, the magnetization of the magnetization rotation layer 50 is oscillated by a thermally excited spin wave without using the spin transfer torque from the magnetic pinned layer as in the magnetic recording device described above with reference to FIGS. 1, 5, 6, and 7. Generating a thermally excited spin wave in a fine magnetic material enables the magnetization to oscillate at the resonant frequency. Consequently, a radio-frequency magnetic field can be generated outside the magnetic material. Let Ku denote the magnetic anisotropy of the fine magnetic material, V the volume, k the Boltzmann constant, and T the temperature. Then KuV/kT is preferably less than 3 for thermal excitation. At this value or higher, thermally induced oscillation is difficult to occur. Furthermore, Ku is preferably 400 $J/m^3$ or more. At a value less than this, the frequency of the radio-frequency magnetic field is less than GHz, which is less than the resonant frequency of the magnetic recording layer 30 and does not satisfy the characteristics required for an oscillator. Thus it is preferable that the following formula be satisfied as a condition for the magnetic anisotropy of the magnetization rotation layer 50 in this embodiment:

$$400\ (J/m^3) < Ku < 3kT/V$$

It can be seen that this is significantly different from the condition for the magnetic recording layer described earlier.

To perform recording on this magnetic recording device, at least, a current needs to be passed between the magnetic pinned layer 10a and the magnetic recording layer 30. If an electron current is passed using electrodes, not shown, connected to the magnetic pinned layer 10a and the magnetization rotation layer 50, the intermediate layer 40a and the magnetization rotation layer 50 are located on the current path. In this case, the intermediate layer 40a is made of a spin quenching layer. If spin information is retained in the intermediate layer 40a, the magnetization rotation layer 50 responds to the effect of the spin information (spin transfer torque) of spin-polarized electrons passing through or reflected at the magnetic recording layer 30, and the magnetization of the magnetization rotation layer 50 is interlocked with the magnetic recording layer 30, hence failing to operate as an oscillator. To prevent this, the spin quenching layer is needed.

The magnetization rotation layer 50 can be made of a normal ferromagnet. In the case of using cobalt (Co) or a cobalt (Co) alloy, the magnetization easy axis of the magnetization rotation layer 50 is generally perpendicular to the film plane. In the case where the magnetization rotation layer 50 with a magnetization easy axis directed generally perpendicular to the film plane is fluctuated, a radio-frequency magnetic field having a component generally parallel to the film plane can be produced. Hence the effect of a radio-frequency magnetic field produced by the magnetization rotation layer 50 can be equally achieved irrespective of whether the magnetization easy axis of the magnetic recording layer 30 is perpendicular or parallel to the film plane as shown in FIGS. 13 and 14.

Thus, in the magnetic recording device of this embodiment, the leakage magnetic field from the magnetization rotation layer 50 can be applied as a radio-frequency magnetic field to the magnetic recording layer 30 by using the basic structure: magnetic pinned layer 10a/barrier layer 20/magnetic recording layer 30/intermediate layer 40a/magnetization rotation layer 50.

In the magnetic recording device of this embodiment, an antiferromagnetic layer, not shown, can be attached to the magnetic pinned layer 10a to reinforce the pinning effect thereof. Furthermore, the effect of this embodiment is the same even if the magnetic recording device is inverted upside down in these figures. Moreover, in the structure with the magnetic recording device inverted upside down, the end point of multilayer milling can be located immediately above the magnetic pinned layer 10a, or halfway through the magnetic pinned layer 10a. The effect of this embodiment is the same even if the end point is located immediately above or halfway through the intermediate layer 40a.

In the following, this embodiment is described in more detail with reference to specific examples.

Figure 15:
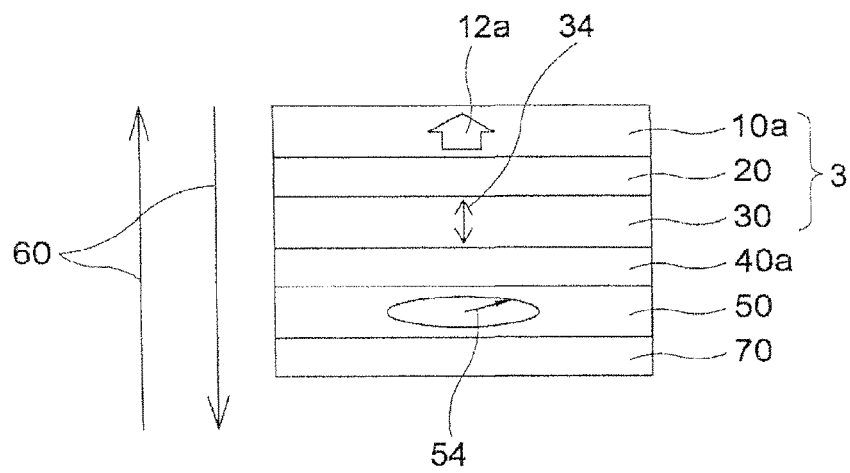
FIG. 15 is a schematic view illustrating the cross-sectional structure of a magnetic recording device according to a specific example of this embodiment.

FIG. 15 is a schematic view illustrating the cross-sectional structure of a magnetic recording device according to a specific example of this embodiment.

Figure 16:
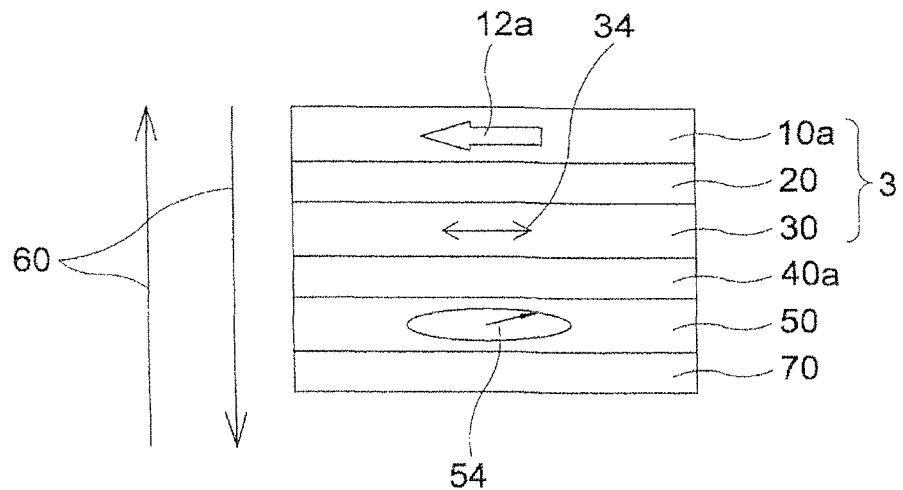
FIG. 16 is a schematic view illustrating the cross-sectional structure of a magnetic recording device according to another specific example of this embodiment.

FIG. 16 is a schematic view illustrating the cross-sectional structure of a magnetic recording device according to another specific example of this embodiment.

The magnetic recording device shown in FIGS. 15 and 16 comprises a magnetic recording section 3, an intermediate layer 40a, a magnetization rotation layer 50, and a buffer layer 70. In the magnetic recording device shown in FIG. 15, the magnetic recording section 3 includes a magnetic pinned layer 10a with a magnetization 12a fixed generally perpendicular to the film plane, a magnetic recording layer 30 with a magnetization easy axis 34 directed generally perpendicular to the film plane, and a barrier layer 20 disposed between the magnetic pinned layer 10a and the magnetic recording layer 30.

In the magnetic recording device shown in FIG. 16, the magnetic recording section 3 includes a magnetic pinned layer 10a with a magnetization 12a fixed generally parallel to the film plane, a magnetic recording layer 30 with a magnetization easy axis 34 directed generally parallel to the film plane, and a barrier layer 20 disposed between the magnetic pinned layer 10a and the magnetic recording layer 30.

In the magnetic recording device of both these specific examples, the buffer layer 70, the magnetization rotation layer 50, the intermediate layer 40a, the magnetic recording layer 30, the barrier layer 20, and the magnetic pinned layer 10a are laminated in this order. These layers are made of materials as follows: magnetic pinned layer 10a, CoFePt; barrier layer 20, MgO; magnetic recording layer 30, CoFePt; intermediate layer 40a, ruthenium (Ru); magnetization rotation layer 50, cobalt (Co); buffer layer 70, ruthenium (Ru). An electron current 60 can be passed through this magnetic recording device using electrodes, not shown, connected to the magnetic pinned layer 10a and the buffer layer 70.

In the magnetic recording device of these specific examples, the buffer layer 70 made of ruthenium (Ru) is disposed also on the opposite side (lower side in these figures) of the intermediate layer 40a across the magnetization rotation layer 50. Thus the closest-packed plane of the cobalt (Co) crystal grows parallel to the interface. Consequently, the perpendicular magnetic anisotropy can be strengthened, and the rotation axis of precession can be clearly defined. This provides the advantage of being able to reduce variation in characteristics. The thickness of the magnetization rotation layer 50 made of cobalt (Co) is preferably 10 nm or less in view of oscillation characteristics.

Figure 17:
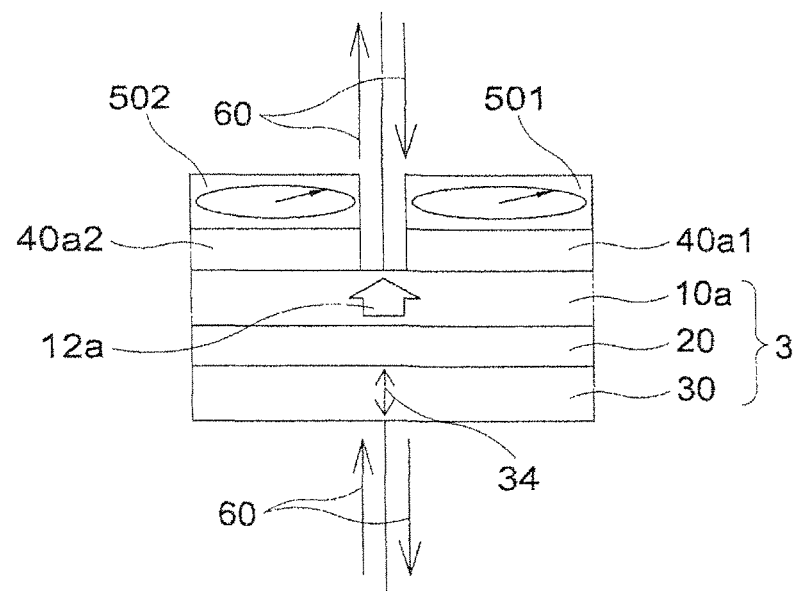
FIG. 17 is a schematic view illustrating the cross-sectional structure of a magnetic recording device according to another specific example of this embodiment.
Figure 18:
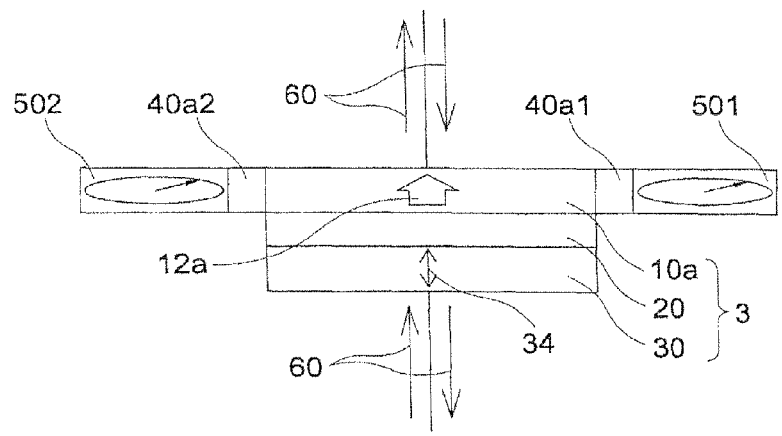
FIG. 18 is a schematic view illustrating the cross-sectional structure of a magnetic recording device according to still another specific example of this embodiment.

FIGS. 17 and 18 are schematic views illustrating the cross-sectional structure of magnetic recording devices according to still another specific example of this embodiment.

The magnetic recording device shown in FIGS. 17 and 18 comprises a magnetic recording section 3, intermediate layers 40a1, 40a2, and magnetization rotation layers 501, 502. The magnetic recording section 3 includes a magnetic pinned layer 10a with a magnetization 12a fixed generally perpendicular to the film plane, a magnetic recording layer 30 with a magnetization easy axis 34 directed generally perpendicular to the film plane, and a barrier layer 20 disposed between the magnetic pinned layer 10a and the magnetic recording layer 30.

In the magnetic recording device shown in FIG. 17, the magnetic recording layer 30, the barrier layer 20, and the magnetic pinned layer 10a are laminated in this order. The magnetization rotation layers 501, 502 are further laminated on the upper surface of the magnetic pinned layer 10a via the intermediate layers 40a1, 40a2. The magnetization rotation layers 501, 502 and the intermediate layers 40a1, 40a2 are not located on the current path of the magnetic recording section 3, and are insulated from the electron current 60, or have a structure through which no current can flow. Because the intermediate layers 40a1, 40a2 are not located on the current path, the material of the intermediate layers 40a1, 40a2 is not limited to that of the spin quenching layer, but they can be made of the material of the spin transfer layer, or an insulator.

In the magnetic recording device shown in FIG. 18, the magnetic recording layer 30, the barrier layer 20, and the magnetic pinned layer 10a are laminated in this order. The magnetization rotation layer 501 is further laminated on the right side surface of the magnetic pinned layer 10a via the intermediate layer 40a1, and the magnetization rotation layer 502 is further laminated on the left side surface of the magnetic pinned layer 10a via the intermediate layer 40a2. Like the magnetic recording device of FIG. 17, the magnetization rotation layers 501, 502 are insulated from the electron current 60, or have a structure through which no current can flow. Because the intermediate layers 40a1, 40a2 are not located on the current path, the material of the intermediate layers 40a1, 40a2 is not limited to that of the spin quenching layer, but they can be made of the material of the spin transfer layer, or an insulator.

Thus, also in the structure where the magnetization rotation layers 501, 502 are insulated from the electron current 60, a spin wave is thermally excited in the magnetization rotation layers 501, 502 of these specific examples to generate a radio-frequency magnetic field, achieving the same effect as described above with reference to FIGS. 13 to 16. It is noted that, alternatively, the magnetization 12a and the magnetization easy axis 34 can be generally parallel to the film plane.

As described above, according to this embodiment, a spin wave is thermally excited in the magnetization rotation layer 50, 501, 502 to generate a radio-frequency magnetic field. This improves the reversal efficiency of the magnetization 32 of the magnetic recording layer 30 irrespective of whether the magnetization rotation layer 50, 501, 502 is located on the current path of the magnetic recording section 3. This allows reduced variation in magnetization reversal without degrading thermal fluctuation resistance and MR (magnetoresistive effect) characteristics. Moreover, the rate of magnetization reversal can be increased. Furthermore, the value of write current can be also reduced.

Next, a third embodiment of the invention is described.

Figure 19:
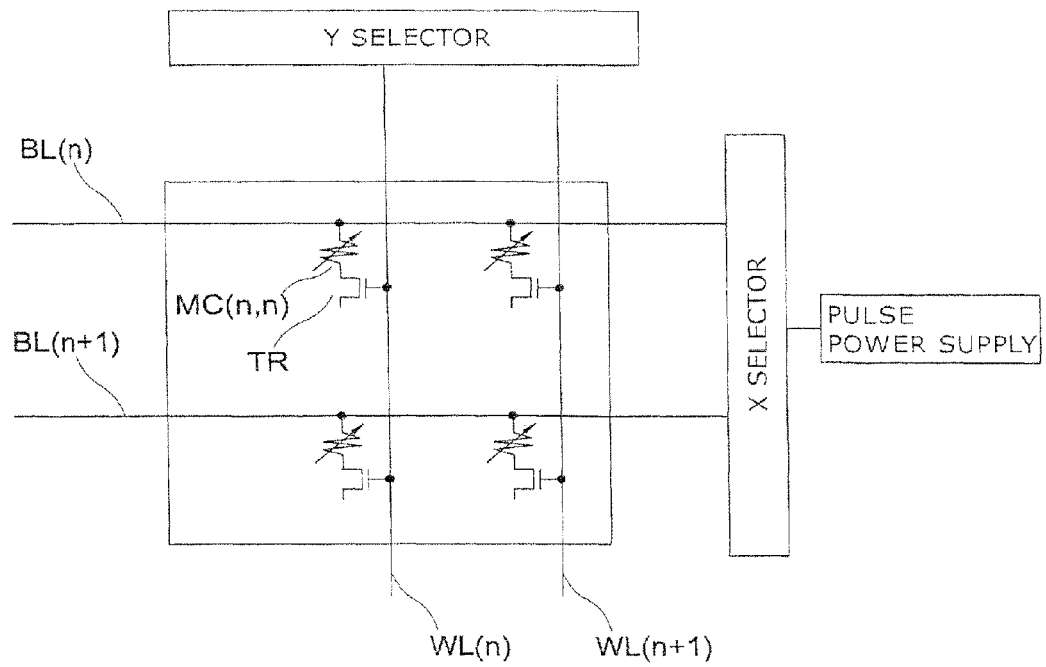
FIG. 19 is a plan view illustrating a magnetic recording apparatus according to a third embodiment of the invention.

FIG. 19 is a plan view illustrating a magnetic recording apparatus according to the third embodiment of the invention.

The magnetic recording apparatus of this embodiment uses the magnetic recording device of the first embodiment or the magnetic recording device of the second embodiment as a magnetic cell. A switching device (e.g., transistor) is connected in series to the magnetic cell. Each magnetic cell is connected to one addressing row (bit line), and each switching device is connected to one addressing column (word line). The magnetic recording apparatus of this embodiment also includes a power supply for generating a current having a pulse width of 18 nanoseconds or less and 50 picoseconds or more at the time of recording.

Selection of a magnetic cell is enabled by specifying the word line and the bit line connected to the magnetic cell. More specifically, the bit line is specified to turn on the switching device, thereby passing a current through the magnetic cell interposed between the word line and the electrode. Here, recording can be performed by passing a write current higher than the critical magnetization reversal current, which is determined by the size, structure, and composition of the magnetic cell. It is noted that, alternatively, the switching device can be made of a diode. This switching device preferably has a low resistance during ON time.

Because the magnetic recording apparatus of this embodiment uses the magnetic recording device of the first embodiment or the magnetic recording device of the second embodiment as a magnetic cell, it can significantly reduce variation in magnetization reversal in the case where the recording current has a width of 18 ns or less, particularly 10 ns or less. Furthermore, the value of write current can be also reduced. It turns out from the simulation result shown in FIG. 11 that there is no effect of radio-frequency magnetic field in the case where the pulse width is larger than 18 to 20 nanoseconds. A pulse width of this value or less is preferable to achieve the effect of reducing variation. In particular, a write pulse width of 10 nanoseconds or less is more preferable to significantly achieve the effect. On the other hand, with a pulse width of less than 50 picoseconds, the time required for reversal cannot be gained.

The embodiments of the invention have been described. However, the invention is not limited to the foregoing description. The above embodiments can be suitably modified by those skilled in the art without departing from the spirit of the invention, and any such modifications are also encompassed within the scope of the invention. For example, the magnetic pinned layer of the magnetic recording section can be an antiferromagnetic layer, a synthetic antiferromagnetic layer, or a dual pin structure. Furthermore, the figures related to the magnetic recording device according to the embodiments of the invention can be inverted upside down. Cross sections of the elements may be rectangular as shown in the figures, or may be trapezoidal or any other configuration, including stacked structures where widths of each layers may be different each other.

The elements included in the above embodiments can be combined with each other as long as technically feasible without departing from the spirit of the invention, and such combinations are also encompassed within the scope of the invention.

We claim:

1. A magnetic recording device comprising:
a magnetic recording section;
a magnetization oscillator overlapping the magnetic recording section in a stacking direction; and
a first nonmagnetic layer provided between the magnetic recording section and the magnetization oscillator,
the magnetic recording section including:
a first ferromagnetic layer having a first magnetization;
a second ferromagnetic layer overlapping the first ferromagnetic layer in the stacking direction, the second ferromagnetic layer having a second magnetization; and
a second nonmagnetic layer provided between the first ferromagnetic layer and the second ferromagnetic layer,
the magnetization oscillator including:
a third ferromagnetic layer having a third magnetization;
a fourth ferromagnetic layer overlapping the third ferromagnetic layer in the stacking direction, the fourth ferromagnetic layer having a fourth magnetization; and
a third nonmagnetic layer provided between the third ferromagnetic layer and the fourth ferromagnetic layer, wherein
the third ferromagnetic layer generates a radio-frequency magnetic field depending on a current passing through the first ferromagnetic layer, the second ferromagnetic layer, the second nonmagnetic layer, the third ferromagnetic layer, the fourth ferromagnetic layer, the third nonmagnetic layer and the first nonmagnetic layer in the stacking direction,
the radio-frequency magnetic field is applied to the second ferromagnetic layer, and
a direction of the second magnetization changes in response to a direction of the current.

2. The device according to claim 1, wherein the third magnetization is able to undergo precession by the current.

3. The device according to claim 1, wherein
the second nonmagnetic layer includes at least one selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V), or an alloy containing at least one element selected from the group consisting of ruthenium (Ru), tantalum (Ta), tungsten (W), platinum (Pt), palladium (Pd), molybdenum (Mo), niobium (Nb), airconium (Zr), titanium (Ti), and banadium (V), and
the second nonmagnetic layer has a thickness of 1.4 nm or more and 20 nm or less.

4. The device according to claim 1, wherein the second nonmagnetic layer includes an electrically insulative material.

5. The device according to claim 1, wherein the second nonmagnetic layer includes
a single layer, the single layer including at least one selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V).

6. The device according to claim 5, wherein the single layer includes an alloy containing at least one element selected from the group consisting of ruthenium (Ru), tantalum (Ta), tungsten (W), platinum (Pt), palladium (Pd), molybdenum (Mo), niobium (Nb), zirconium (Zr), titanium (Ti), and vanadium (V).

7. The device according to claim 5, wherein the second nonmagnetic layer further includes a copper (Cu) layer provided on one side or both sides of the single layer.

8. The device according to claim 5, wherein the second nonmagnetic layer further includes an oxide layer provided on one side or both sides of the single layer, and the oxide layer contains at least one element selected from the group consisting of aluminum (Al), magnesium (Mg), titanium (Ti), iron (Fe), cobalt (Co), nickel (Ni), vanadium (V), chromium (Cr), tantalum (Ta), tungsten (W), and ruthenium (Ru).

9. The device according to claim 1, wherein a direction of the first magnetization is substantially fixed in a first direction.

10. The device according to claim 9, wherein a direction of the fourth magnetization is substantially fixed in a second direction.

11. The device according to claim 10, wherein
the first direction is generally perpendicular to the stacking direction, and
the second direction is generally parallel to the stacking direction.

12. The device according to claim 10, wherein
the first direction is generally parallel to the stacking direction, and
the second direction is generally parallel to the stacking direction.

13. A magnetic recording device comprising:
a body including
a first ferromagnetic layer having a first magnetization,
a second ferromagnetic layer overlapping with the first ferromagnetic layer in a stacking direction, the second ferromagnetic layer having a second magnetization, and
a first nonmagnetic layer provided between the first ferromagnetic layer and the second ferromagnetic layer; and
a third ferromagnetic layer overlapping the body in the stacking direction, the third ferromagnetic layer having a third magnetization, and
a second nonmagnetic layer provided between the body and the third ferromagnetic layer, wherein
the third ferromagnetic layer generates a radio-frequency magnetic field depending on a current passing through the first ferromagnetic layer, the second ferromagnetic layer, the first nonmagnetic layer and the second nonmagnetic layer in the stacking direction,
the radio-frequency magnetic field is applied to the second ferromagnetic layer, and
a direction of the second magnetization changes in response to a direction of the current.

14. The device according to claim 13, wherein the first nonmagnetic layer includes an electrically insulative material.

15. The device according to claim 13, wherein the third magnetization is able to undergo precession by thermal excitation.

16. The device according to claim 13, wherein a direction of the first magnetization is substantially fixed in a first direction.

* * * * *